United States Patent
Yan et al.

(10) Patent No.: US 11,469,170 B2
(45) Date of Patent: Oct. 11, 2022

(54) MULTILEVEL INTERCONNECTION STRUCTURE AND METHOD FOR FORMING THE SAME

(71) Applicants: TAIWAN SEMICONDUCTOR MANUFACTURING CO., LTD., Hsinchu (TW); TSMC Nanjing Company Limited, Nanjing (CN); TSMC China Company Limited, Shanghai (CN)

(72) Inventors: Zhang-Ying Yan, Nanjing (CN); Xin-Yong Wang, Shanghai (CN)

(73) Assignees: TAIWAN SEMICONDUCTOR MANUFACTURING CO., LTD., Hsinchu (TW); TSMC NANJING COMPANY LIMITED, Nanjing (CN); TSMC CHINA COMPANY LIMITED, Shanghai (CN)

( * ) Notice: Subject to any disclaimer, the term of this patent is extended or adjusted under 35 U.S.C. 154(b) by 11 days.

(21) Appl. No.: 17/018,560

(22) Filed: Sep. 11, 2020

(65) Prior Publication Data

US 2022/0028781 A1 Jan. 27, 2022

(30) Foreign Application Priority Data

Jul. 24, 2020 (CN) .......................... 202010723363.3

(51) Int. Cl.
*H01L 23/528* (2006.01)
*H01L 21/321* (2006.01)
(Continued)

(52) U.S. Cl.
CPC .... *H01L 23/5226* (2013.01); *H01L 21/76224* (2013.01); *H01L 21/76802* (2013.01);
(Continued)

(58) Field of Classification Search
CPC ......... H01L 21/76802; H01L 21/76877; H01L 21/76885; H01L 21/32115–32138;
(Continued)

(56) References Cited

U.S. PATENT DOCUMENTS

| | | | |
|---|---|---|---|
| 10,121,875 B1* | 11/2018 | Ho | ...... H01L 29/7843 |
| 2014/0061939 A1* | 3/2014 | Yu | ...... H01L 23/49827 |
| | | | 438/666 |

(Continued)

*Primary Examiner* — Eva Y Montalvo
*Assistant Examiner* — William H Anderson
(74) *Attorney, Agent, or Firm* — Birch, Stewart, Kolasch & Birch, LLP

(57) ABSTRACT

A semiconductor device includes a substrate, an active region, an isolation structure, a first metal line, gate structure, source/drain region, a source/drain contact, and a second metal line. The active region protrudes from a top surface of the substrate. The isolation structure is over the substrate and laterally surrounds the active region. The first metal line is in the isolation structure. The gate structure is over the active region. The source/drain region is in the active region. The source/drain contact is over the active region and is electrically connected to the source/drain region. The second metal line is over the gate structure and the source/drain contact, in which the second metal line vertically overlaps the first metal line.

20 Claims, 45 Drawing Sheets

(51) Int. Cl.
  *H01L 21/3105* (2006.01)
  *H01L 23/522* (2006.01)
  *H01L 21/762* (2006.01)
  *H01L 21/768* (2006.01)
  *H01L 27/088* (2006.01)
  *H01L 29/66* (2006.01)

(52) U.S. Cl.
  CPC .. *H01L 21/76877* (2013.01); *H01L 21/76885* (2013.01); *H01L 23/528* (2013.01); *H01L 27/0886* (2013.01); *H01L 29/66795* (2013.01); *H01L 21/31051* (2013.01); *H01L 21/3212* (2013.01)

(58) Field of Classification Search
  CPC ....... H01L 21/76224; H01L 21/823481; H01L 21/823878; H01L 21/76816; H01L 23/528; H01L 23/5386; H01L 23/5226; H01L 29/66863–66886; H01L 27/0207; H01M 6/28
  See application file for complete search history.

(56) References Cited

U.S. PATENT DOCUMENTS

| | | | |
|---|---|---|---|
| 2015/0333002 A1* | 11/2015 | Liu | H01L 21/76816 257/773 |
| 2015/0371685 A1* | 12/2015 | Shin | H01L 27/10885 257/773 |
| 2016/0284707 A1* | 9/2016 | Okagaki | H01L 27/0207 |
| 2017/0125301 A1* | 5/2017 | Ho | H01L 21/0214 |

* cited by examiner

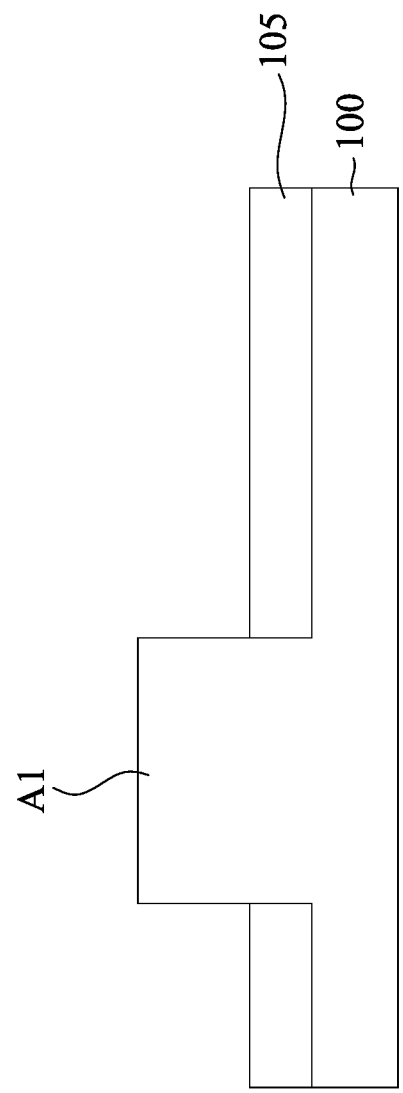

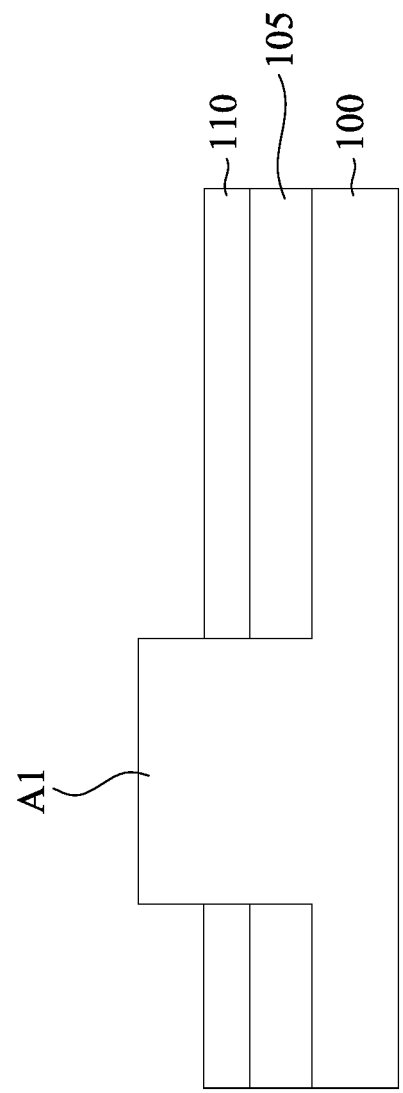

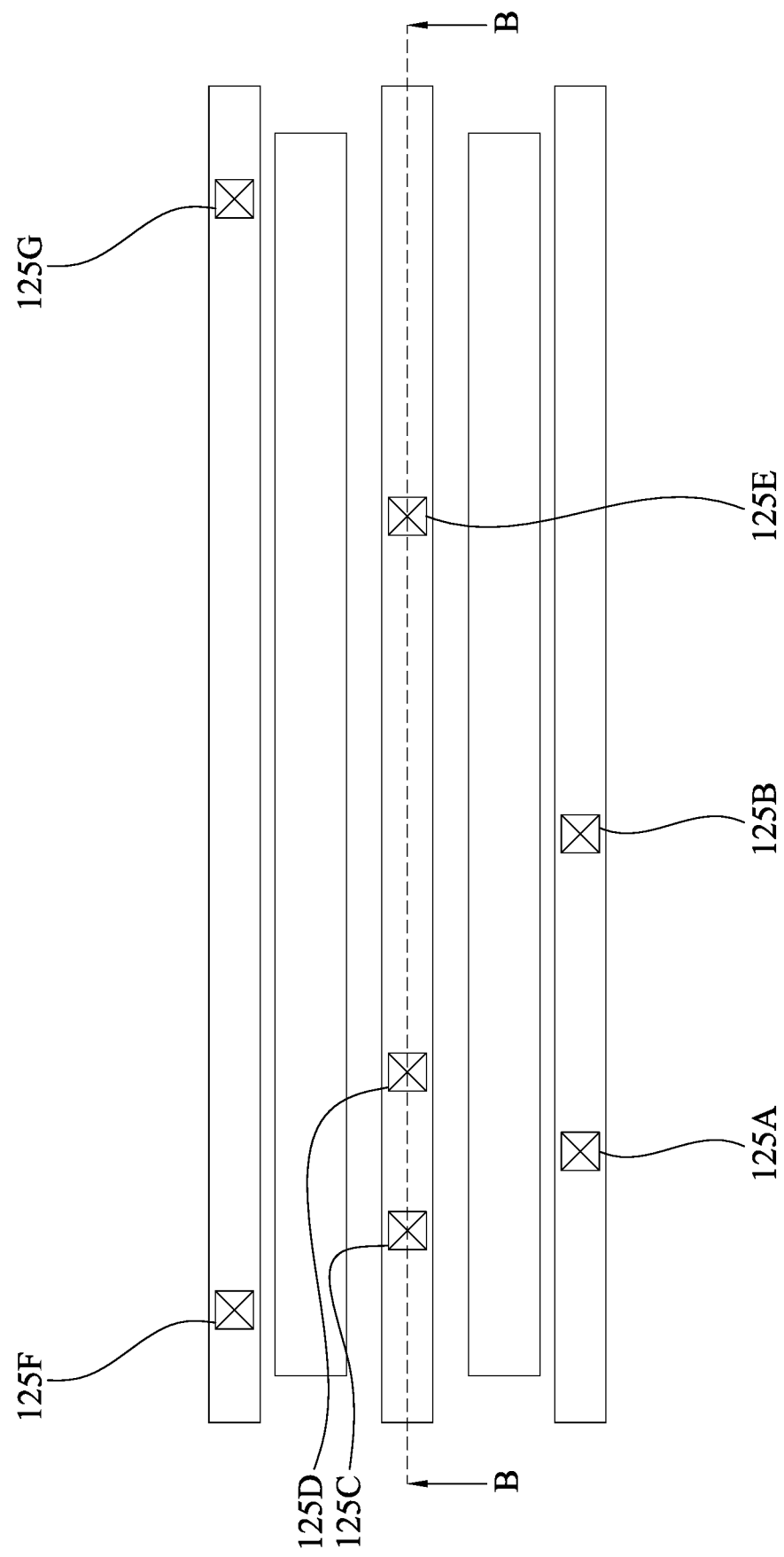

MULTILEVEL INTERCONNECTION STRUCTURE AND METHOD FOR FORMING THE SAME

CROSS-REFERENCE TO RELATED APPLICATION

The present application claims the priority of China Patent Application No. 2020/0723363.3, filed on Jul. 24, 2020, which is hereby incorporated herein by reference in its entirety.

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
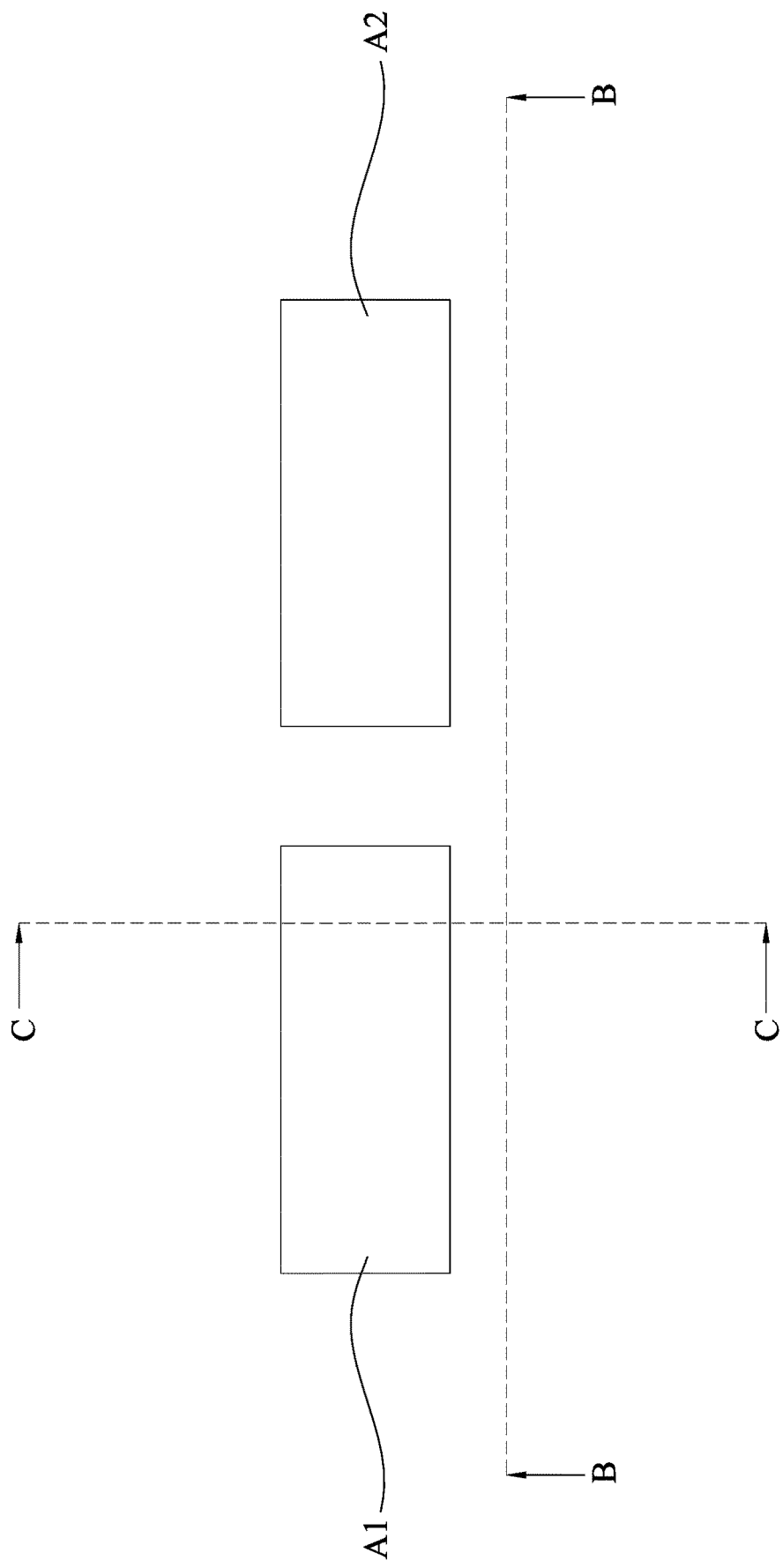
FIGS. 1A to 10C illustrate a method in various stages of fabricating a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIGS. 1A to 10C illustrate a method in various stages of fabricating a semiconductor device in accordance with some embodiments of the present disclosure.

Figure 1B:
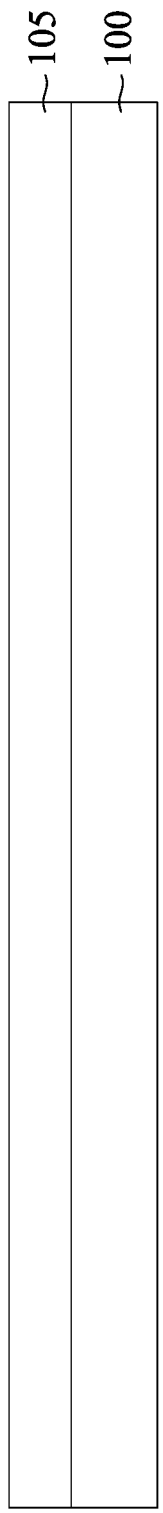

Reference is made to FIGS. 1A to 1C, in which FIG. 1A is a top view of a semiconductor device, FIG. 1B is a cross-sectional view of line B-B of FIG. 1A, and FIG. 1C is a cross-sectional view of line C-C of FIG. 1A. Shown there is a substrate 100. In some embodiments, the substrate 100 may be a semiconductor material and may include known structures including a graded layer or a buried oxide, for example. In some embodiments, the substrate 100 includes bulk silicon that may be undoped or doped (e.g., p-type, n-type, or a combination thereof). Other materials that are suitable for semiconductor device formation may be used. Other materials, such as germanium, quartz, sapphire, and glass could alternatively be used for the substrate 100. Alternatively, the silicon substrate 100 may be an active layer of a semiconductor-on-insulator (SOI) substrate or a multi-layered structure such as a silicon-germanium layer formed on a bulk silicon layer.

A plurality of active regions A1 and A2 are formed over the substrate 100. In some embodiments, the active regions A1 and A2 may be formed by patterning the substrate 100 by photolithography process. For example, a photoresist layer (not shown) is formed over the substrate 100, in which the photoresist layer covers portions of the substrate 100 that define the positions of the active regions A1 and A2. Then, an etching process is performed to partially remove materials of the substrate 100, and the remaining materials protruding from the substrate 100 can be referred to as the active regions A1 and A2. After the etching process, the photoresist layer is removed. In some embodiments, the active regions A1 and A2 are semiconductor fins protruding from the substrate 100.

Then, a dielectric layer 105 is formed over the substrate 100 and surrounding the active regions A1 and A2. In some embodiments, the dielectric layer 105 may be formed by, for example, depositing a dielectric material over the substrate 100 and covering the active regions A1 and A2, performing a chemical mechanism polishing (CMP) process to the dielectric material until top surfaces of the active regions A1 and A2 are exposed, and followed by an etching back process to lower top surfaces of the dielectric material. As a result, the top surface of the dielectric layer 105 is lower than top surfaces of the active regions A1 and A2. In some embodiments, the dielectric layer 105 may include $SiO_2$, $Si_3N_4$, $SiO_xN_y$, fluorine-doped silicate glass (FSG), a low-k dielectric, combinations thereof, and/or other suitable materials.

Figure 2A:
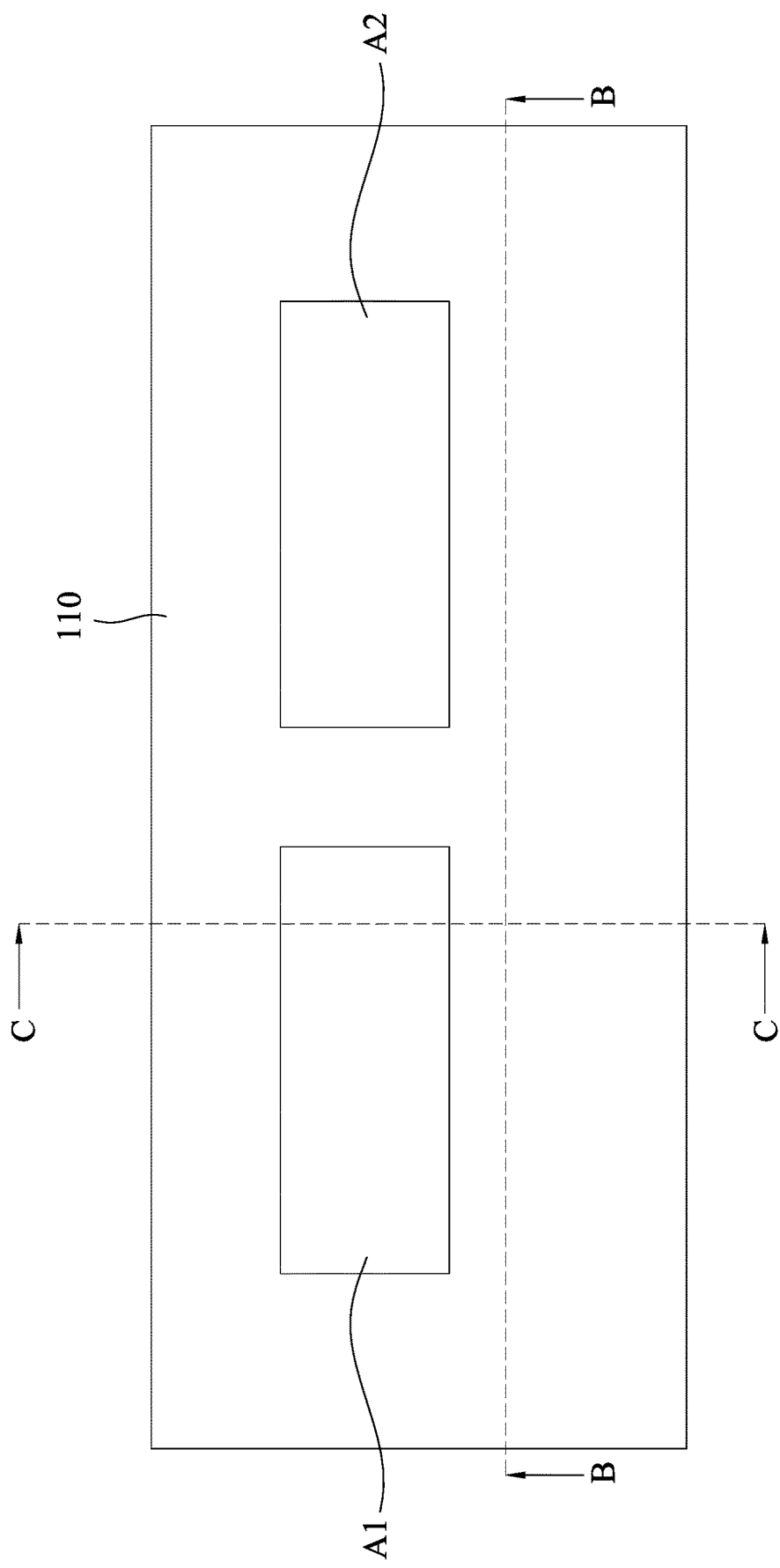
Figure 2B:
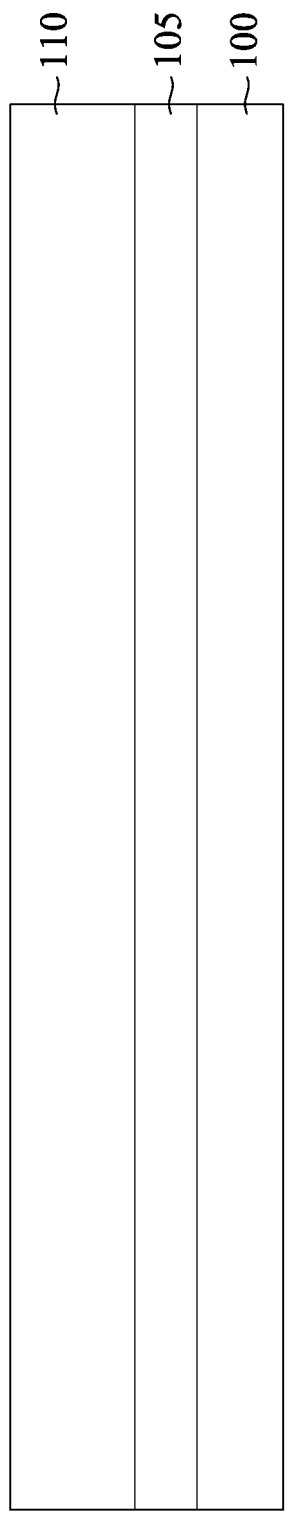
Figure 2C:
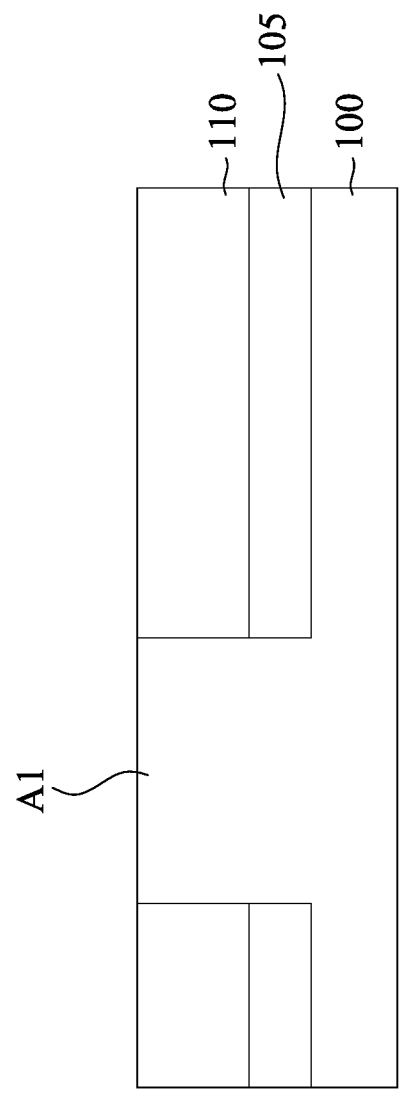

Reference is made to FIGS. 2A to 2C, in which FIG. 2A is a top view of a semiconductor device, FIG. 2B is a cross-sectional view of line B-B of FIG. 2A, and FIG. 2C is a cross-sectional view of line C-C of FIG. 2A. A metal layer 110 is deposited over the substrate 100. In some embodiments, the metal layer 110 may be formed by, for example, depositing a metal material over the substrate 100 and the dielectric layer 105, and followed by a CMP process to remove excessive metal material until top surfaces of the active regions A1 and A2, In some embodiments, the metal layer 110 may include copper (Cu), aluminum (Al), or the like.

Figure 3A:
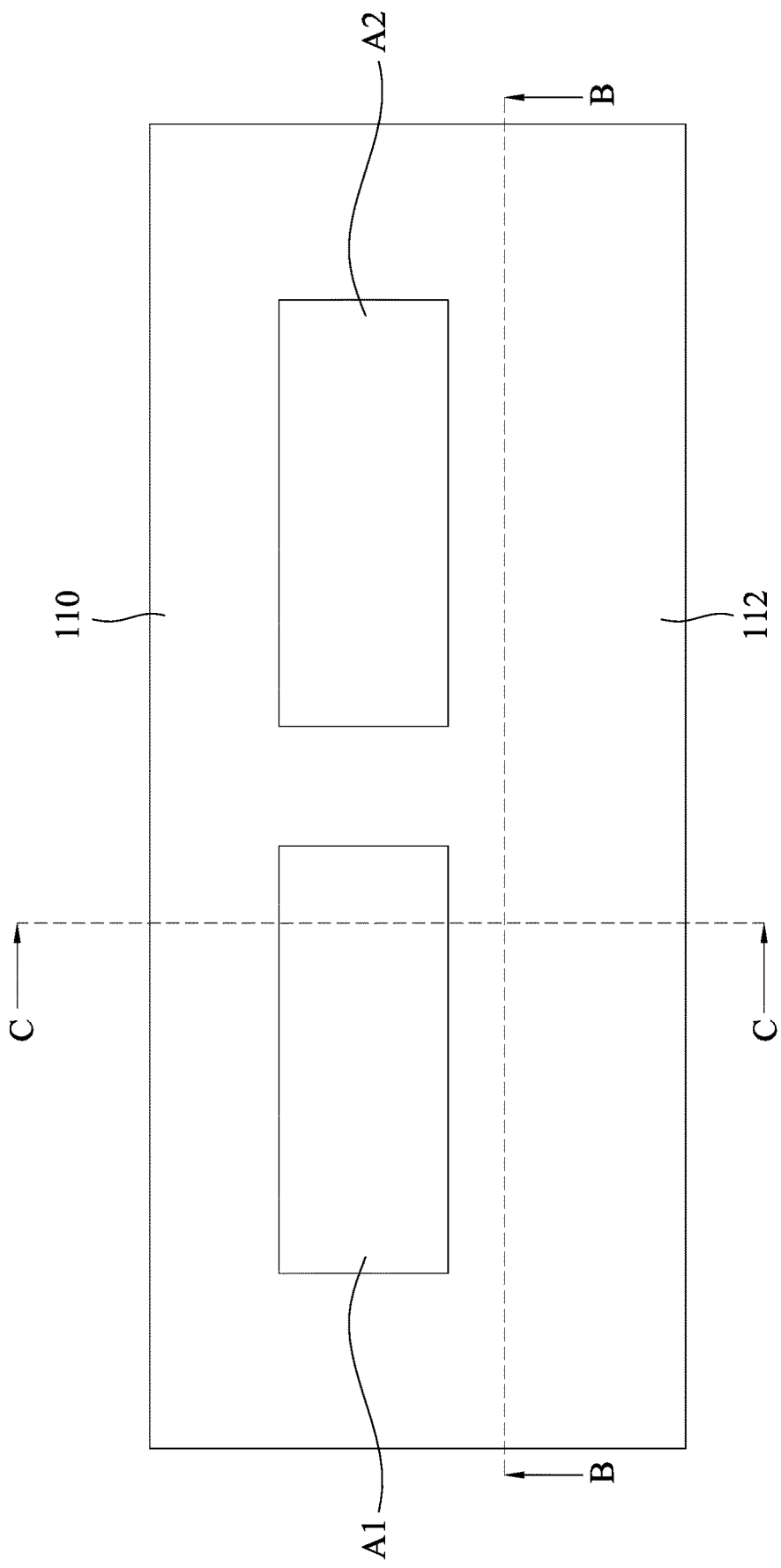
Figure 3B:
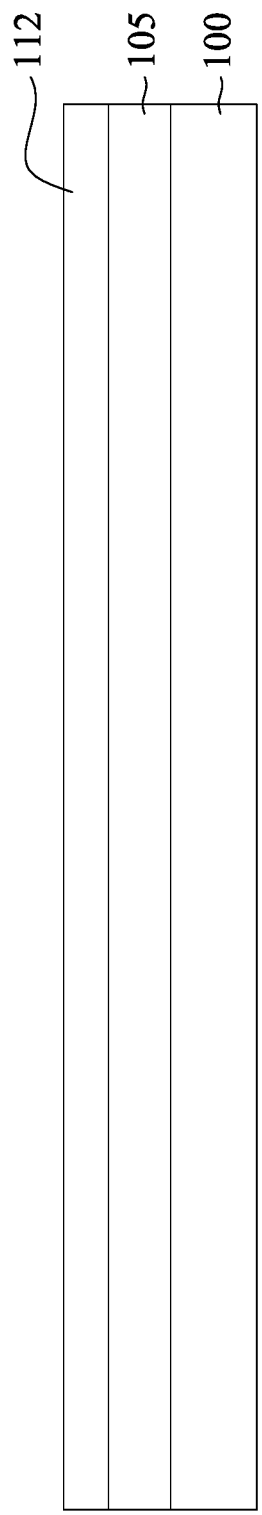

Reference is made to FIGS. 3A to 3C, in which FIG. 3A is a top view of a semiconductor device, FIG. 3B is a cross-sectional view of line B-B of FIG. 3A, and FIG. 3C is a cross-sectional view of line C-C of FIG. 3A. The metal layer 110 is etched back, so as to lower the top surface of the metal layer 110 to a level lower than the top surfaces of the active regions A1 and A2. In some embodiments, the metal layer 110 may be etched by dry etching, wet etching, or combination thereof.

Figure 4A:
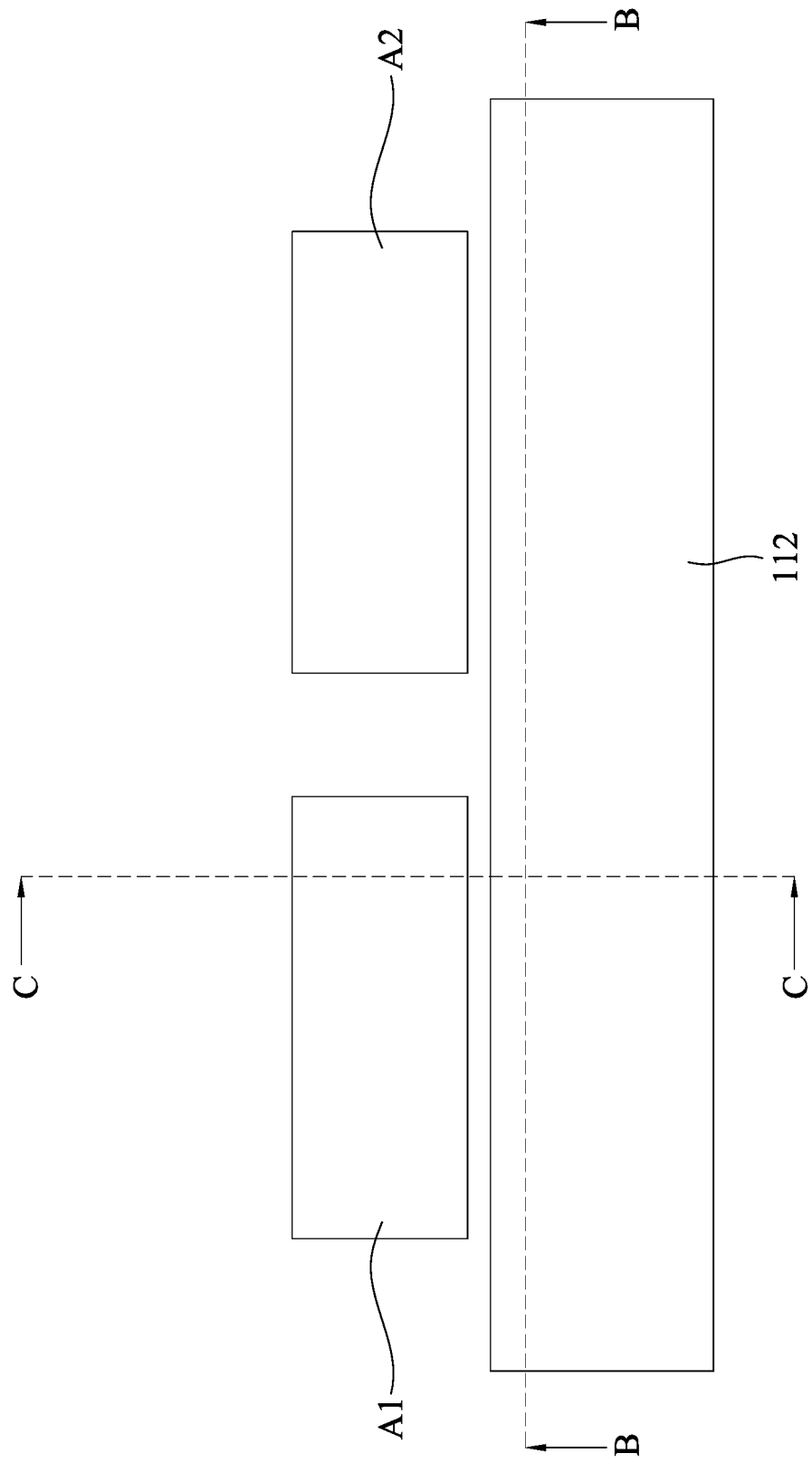
Figure 4B:
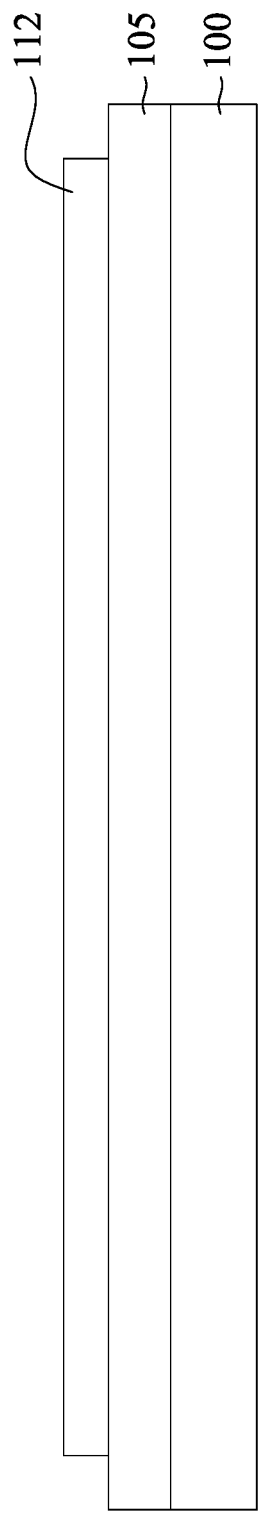
Figure 4C:
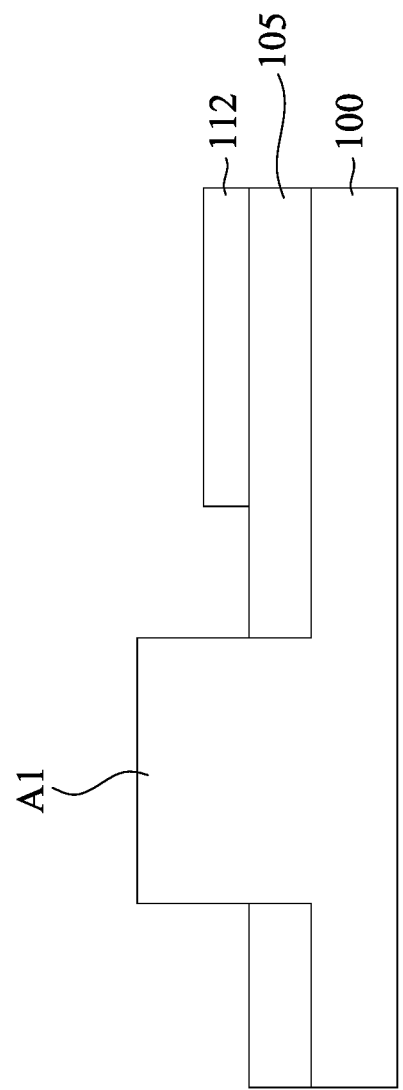

Reference is made to FIGS. 4A to 4C, in which FIG. 4A is a top view of a semiconductor device, FIG. 4B is a cross-sectional view of line B-B of FIG. 4A, and FIG. 4C is a cross-sectional view of line C-C of FIG. 4A. The metal layer 110 is patterned to form a metal line 112. In some embodiments, the metal line 112 can be formed by, for example, forming a photoresist layer (not shown) over the substrate 100, in which the photoresist layer covers portions of the metal layer 110 that define the positions of the metal line 112, and followed by an etching process to remove portions of the metal layer 110 exposed by the photoresist layer. The remaining portion of the metal layer 110 is referred to as the metal line 112. After the etching process, the photoresist layer is removed. In some embodiments, the thickness of the metal line 112 is in a range from about 10 nm to about 100 nm.

Figure 5A:
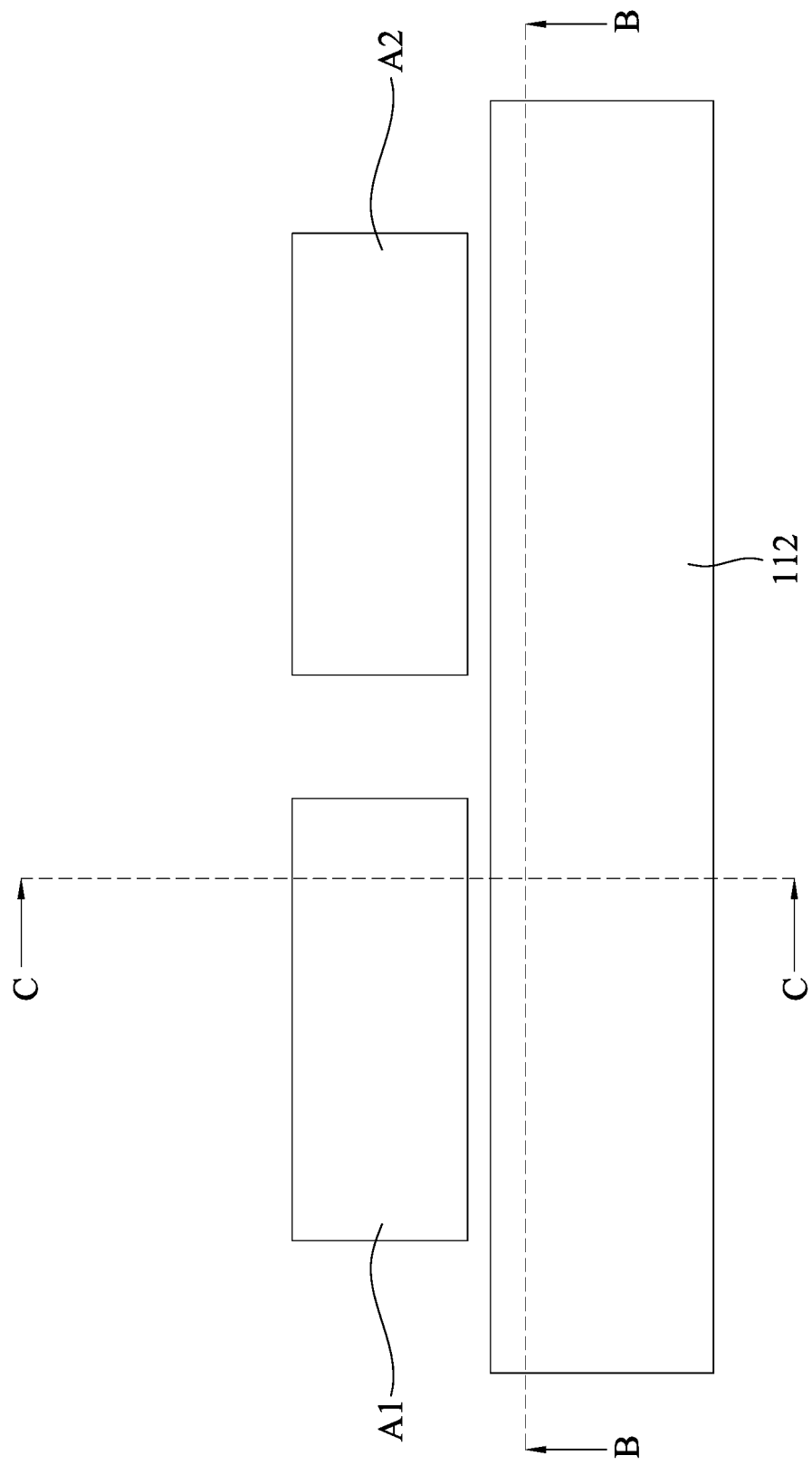
Figure 5B:
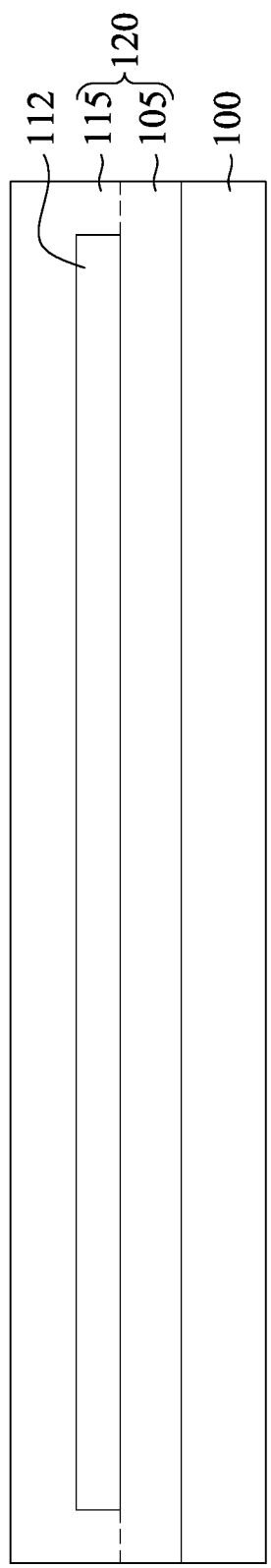
Figure 5C:
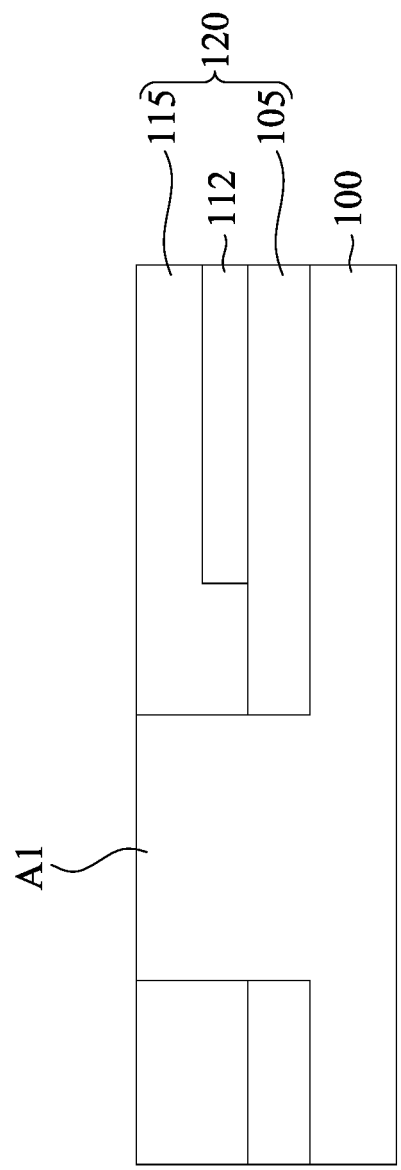

Reference is made to FIGS. 5A to 5C, in which FIG. 5A is a top view of a semiconductor device, FIG. 5B is a cross-sectional view of line B-B of FIG. 5A, and FIG. 5C is a cross-sectional view of line C-C of FIG. 5A. A dielectric layer 115 is deposited over the substrate 100 and covering the metal line 112. The dielectric layer 115 may be formed by, for example, depositing a dielectric material over the substrate 100, and followed by a CMP process to remove excessive dielectric material until top surfaces of the active regions A1 and A2 are exposed. In some embodiments, the dielectric layer 115 is in contact with top surface and sidewalls of the metal line 112, and further in contact with the dielectric layer 105.

In some embodiments, the dielectric layer 115 may include $SiO_2$, $Si_3N_4$, $SiO_xN_y$, fluorine-doped silicate glass (FSG), a low-k dielectric, combinations thereof, and/or other suitable materials. In some embodiments, if the dielectric layers 105 and 115 are made of the same material, the dielectric layers 105 and 115 may not include distinguishable interface therebetween. Accordingly, in FIGS. 5A to 5C, the interface between dielectric layers 105 and 115 is drawn in dashed line. However, in some other embodiments, the dielectric layers 105 and 115 may form a distinguishable interface therebetween, and the interface between dielectric layers 105 and 115 may be coterminous with the bottom surface of the metal line 112.

In some embodiments, the dielectric layers 105 and 115 may be collectively referred to as isolation structure 120. The isolation structure 120 may act as a shallow trench isolation (STI) structure, a deep trench isolation (DTI) structure, another suitable isolation structure(s), a combination of the foregoing, or the like. In some embodiments where the isolation structure 120 is made of oxide (e.g., silicon oxide), the active regions A1 and A2 can be interchangeably referred to as oxide defined (OD) regions. In some embodiments, the bottom surface of the metal line 112 is higher than the bottom surface of the dielectric layer 105 of the isolation structure 120, and is higher than the top surface of the substrate. In some embodiments, sidewalls of the metal line 112 are in contact with the isolation structure 120. In some embodiments, sidewalls of the metal line 112 are separated from the active regions A1 and A2 by the isolation structure 120.

Figure 6A:
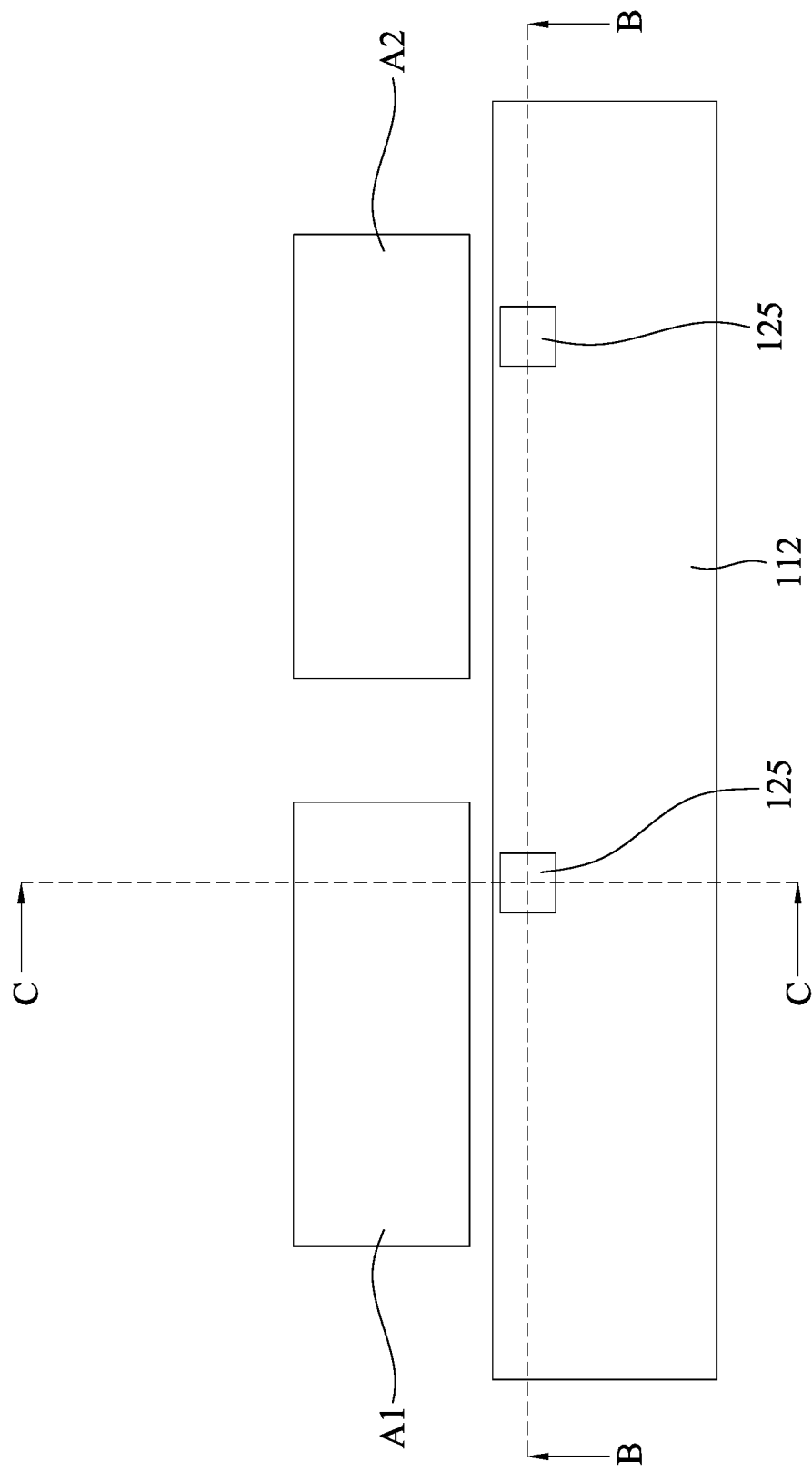
Figure 6B:
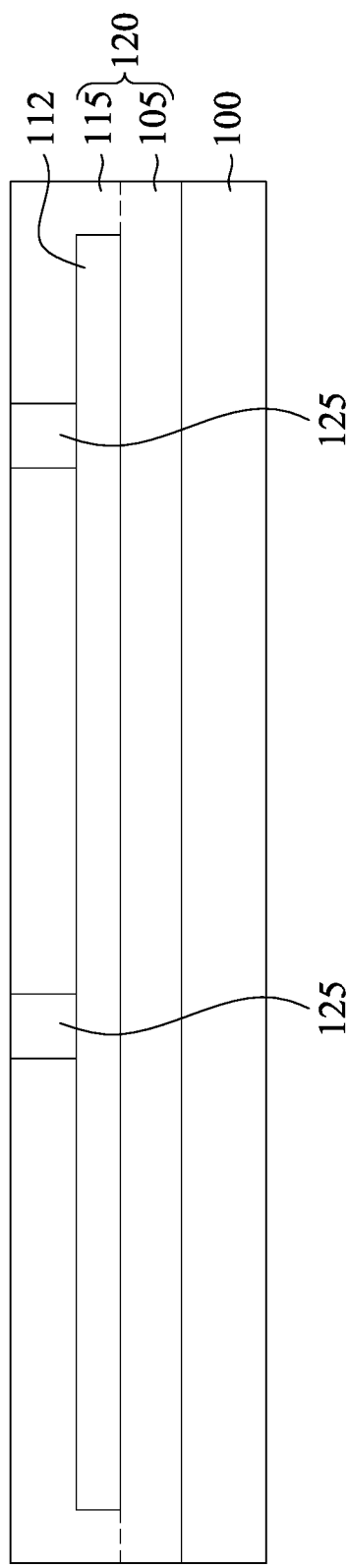
Figure 6C:
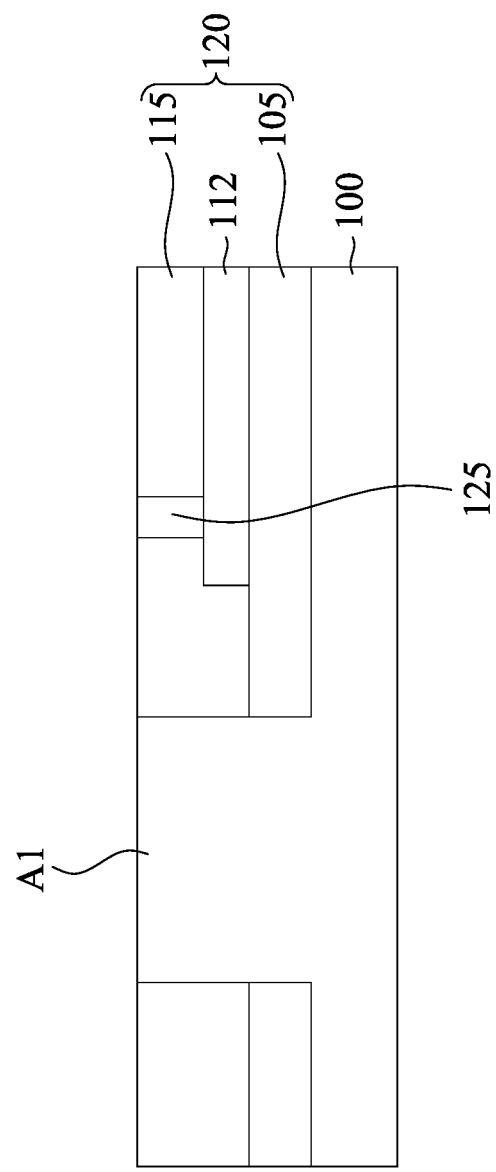

Reference is made to FIGS. 6A to 6C, in which FIG. 6A is a top view of a semiconductor device, FIG. 6B is a cross-sectional view of line B-B of FIG. 6A, and FIG. 6C is a cross-sectional view of line C-C of FIG. 6A. A plurality of conductive vias 125 are formed in the dielectric layer 115 of the isolation structure 120 and contacting the metal line 112. In some embodiments, the conductive vias 125 may be formed by, for example, patterning the dielectric layer 115 of the isolation structure 120 to form openings that define positions of the conductive vias 125, depositing conductive material in the openings, and followed by a CMP process to remove excessive conductive material until top surfaces of the dielectric layer 115 of the isolation structure 120 and the active regions A1 and A2 are exposed. In some embodiments, the conductive vias 125 may include copper (Cu), aluminum (Al), or the like. In some embodiments, the thickness of the conductive vias 125 is in a range from about 10 nm to about 100 nm. In some embodiments, the top surfaces of the conductive vias 125, the top surface of the dielectric layer 115 of the isolation structure 120, and top surfaces of the active regions A1 and A2 are substantially level with (coplanar with) each other. That is, top surfaces of the conductive vias 125 and the top surface of the dielectric layer 115 of the isolation structure 120 are in direct contact and coterminous with each other. The top surface of the dielectric layer 115 of the isolation structure 120 and top surfaces of the active regions A1 and A2 are in direct contact and coterminous with each other.

In some embodiments, the conductive vias 125 and the metal line 112 can be regarded as being embedded in the isolation structure 120. In some embodiments of the present disclosure, an additional conductive path (e.g., the conductive vias 125 and the metal line 112) is previously formed in the isolation structure 120 (or STI structure 120), which will provide a routing resource and further improve the routing flexibility, and can increase chip density (which will be discussed later), and the device performance will be improved accordingly.

Figure 7A:
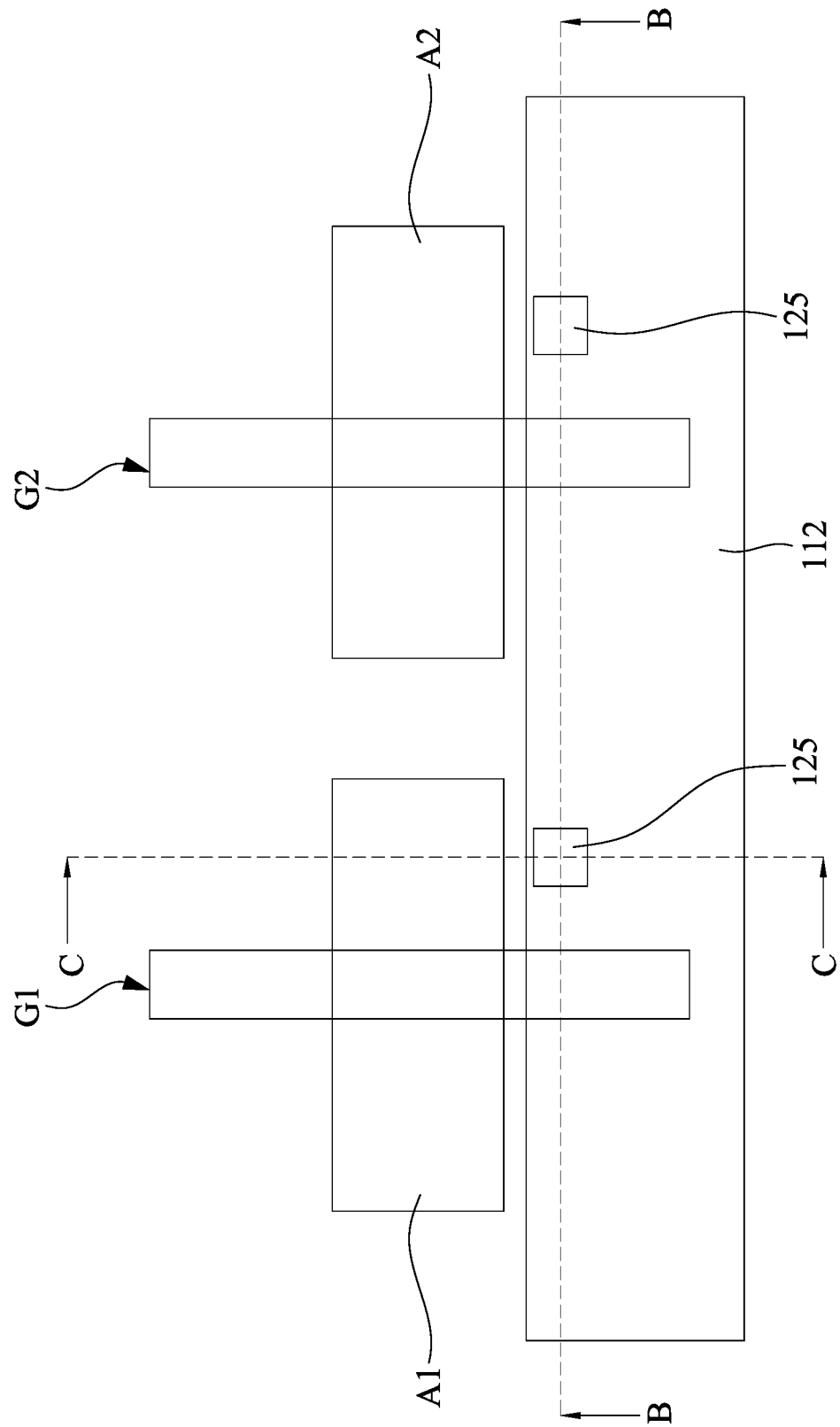
Figure 7B:
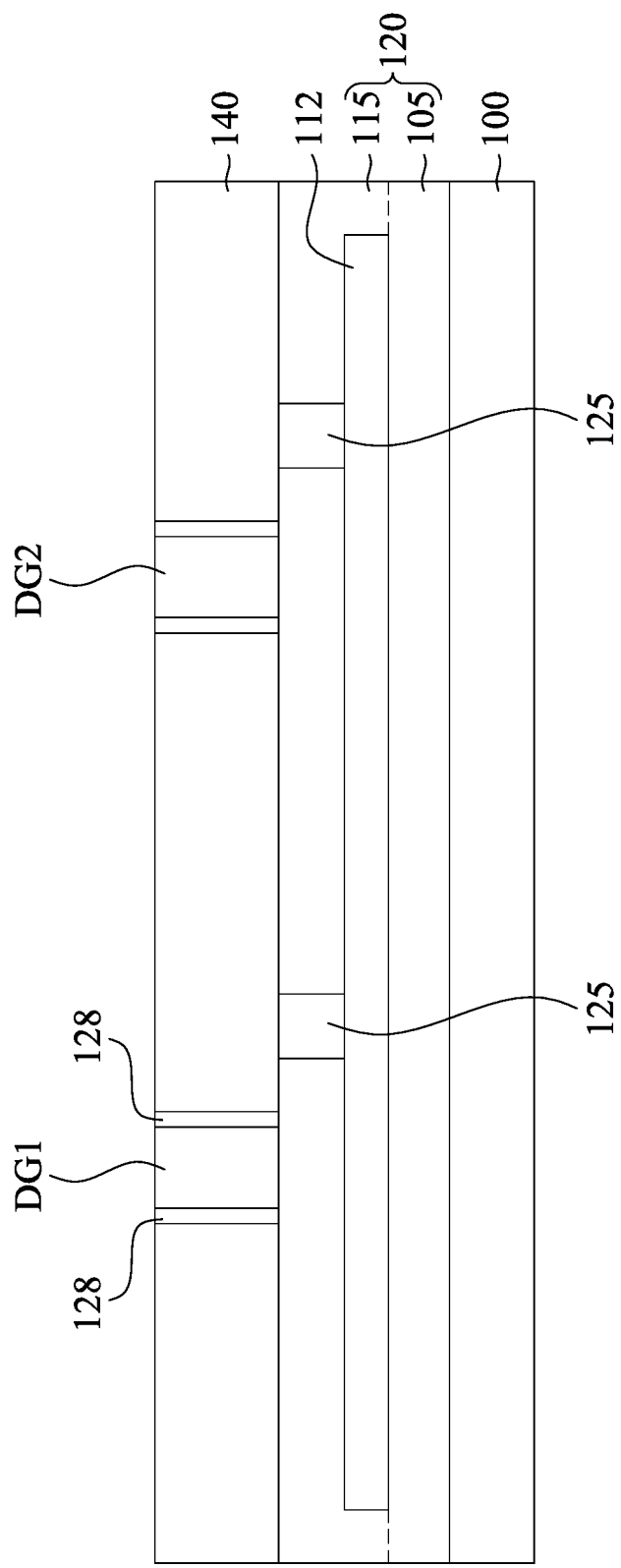
Figure 7C:
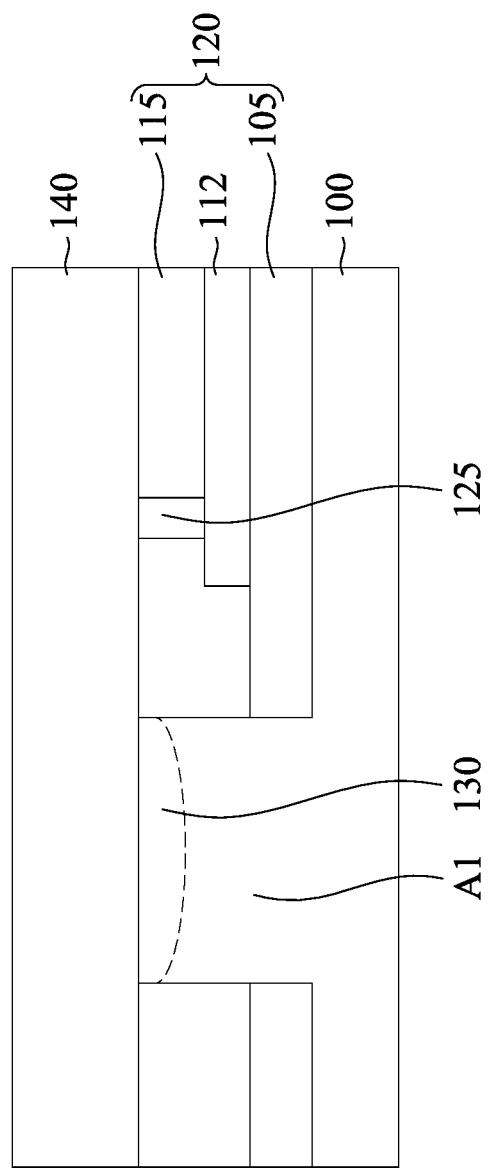

Reference is made to FIGS. 7A to 7C, in which FIG. 7A is a top view of a semiconductor device, FIG. 7B is a cross-sectional view of line B-B of FIG. 7A, and FIG. 7C is a cross-sectional view of line C-C of FIG. 7A. A plurality of gate structures DG1 and DG2 are formed over the substrate 100. In some embodiments, the dummy gate structures DG1 crosses the active region A1, and the dummy gate structures DG2 crosses the active region A2, respectively.

Each of the dummy gate structures DG1 and DG2 may include a gate dielectric layer and a dummy gate. In some embodiments, the dummy gate structures DG1 and DG2 may be formed by, for example, depositing a gate dielectric material and a dummy gate material over the substrate 100, followed by a patterning process to pattern the gate dielectric material and the dummy gate material to form the dummy gate structures DG1 and DG2.

The gate dielectric layer may be, for example, silicon oxide, silicon nitride, a combination thereof, or the like, and may be deposited or thermally grown according to acceptable techniques. The gate dielectric layer may be formed by suitable process, such as chemical vapor deposition (CVD), physical vapor deposition (PVD), atomic layer deposition (ALD), or any suitable process.

The dummy gate layer may include polycrystalline-silicon (poly Si) or poly-crystalline silicon-germanium (poly-SiGe). Further, the dummy gate layer may be doped polysilicon with uniform or non-uniform doping. The dummy gate layer may be formed by suitable process, such as chemical vapor deposition (CVD), physical vapor deposition (PVD), atomic layer deposition (ALD), or any suitable process.

A plurality of gate spacers 128 are formed on opposite sidewalk of the dummy gate structures DG1 and DG2. The gate spacers 128 may be formed by, for example, depositing a spacer layer blanket over the dummy gate structures DG1 and DG2, followed by an etching process to remove horizontal portions of the spacer layer, such that vertical portions of the spacer layer remain on sidewalk of the dummy gate structures DG1 and DG2. In some embodiments, the gate spacers 128 may include $SiO_2$, $Si_3N_4$, $SiO_xN_y$, SiC, SiCN films, SiOC, SiOCN films, and/or combinations thereof.

Then, source/drain regions 130 (only illustrated in see FIG. 7C) are formed in the active regions A1 and A2, and on opposite sides of the dummy gate structures DG1 and DG2. In some embodiments, the source/drain regions 130 are doped semiconductor regions located on opposite sides of the corresponding dummy gate structures DG1 and DG2. In some embodiments, the source/drain regions 130 include p-type dopants such as boron for formation of p-type FETs. In other embodiments, the source/drain regions 132 and 134 include n-type dopants such as phosphorus for formation of n-type FETs.

In some embodiments, the source/drain regions 130 may be epitaxially grown regions. For example, the source/drain regions 130 are formed self-aligned to the gate spacers 128 by first etching the active regions A1 and A2 to form recesses, and then depositing a crystalline semiconductor material in the recess by a selective epitaxial growth (SEG) process that may fill the recesses in the active regions A1 and A2 and may extend further beyond the original surface of the active regions A1 and A2 to form raised source/drain epitaxy structures in some embodiments. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like.

Then, an interlayer dielectric (ILD) layer 140 is disposed over the substrate 100 and surrounding the dummy gate structures DG1 and DG2. In some embodiments, the ILD layer 140 may include silicon oxide, silicon nitride, silicon oxynitride, tetraethoxysilane (TEOS), phosphosilicate glass (PSG), borophosphosilicate glass (BPS), low-k dielectric material, and/or other suitable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The ILD layer 140 may be formed using, for example, CVD, ALD, spin-on-glass (SOG) or other suitable techniques.

In some embodiments, a etch stop layer (ESL) may be formed prior to the ILD layer 140. The ESL may include materials different from the ILD layer 140. In some embodiments, the ESL include silicon nitride silicon oxynitride or other suitable materials. The ESL can be formed using, for example, plasma enhanced CVD, low pressure CVD, ALD or other suitable techniques.

Figure 8A:
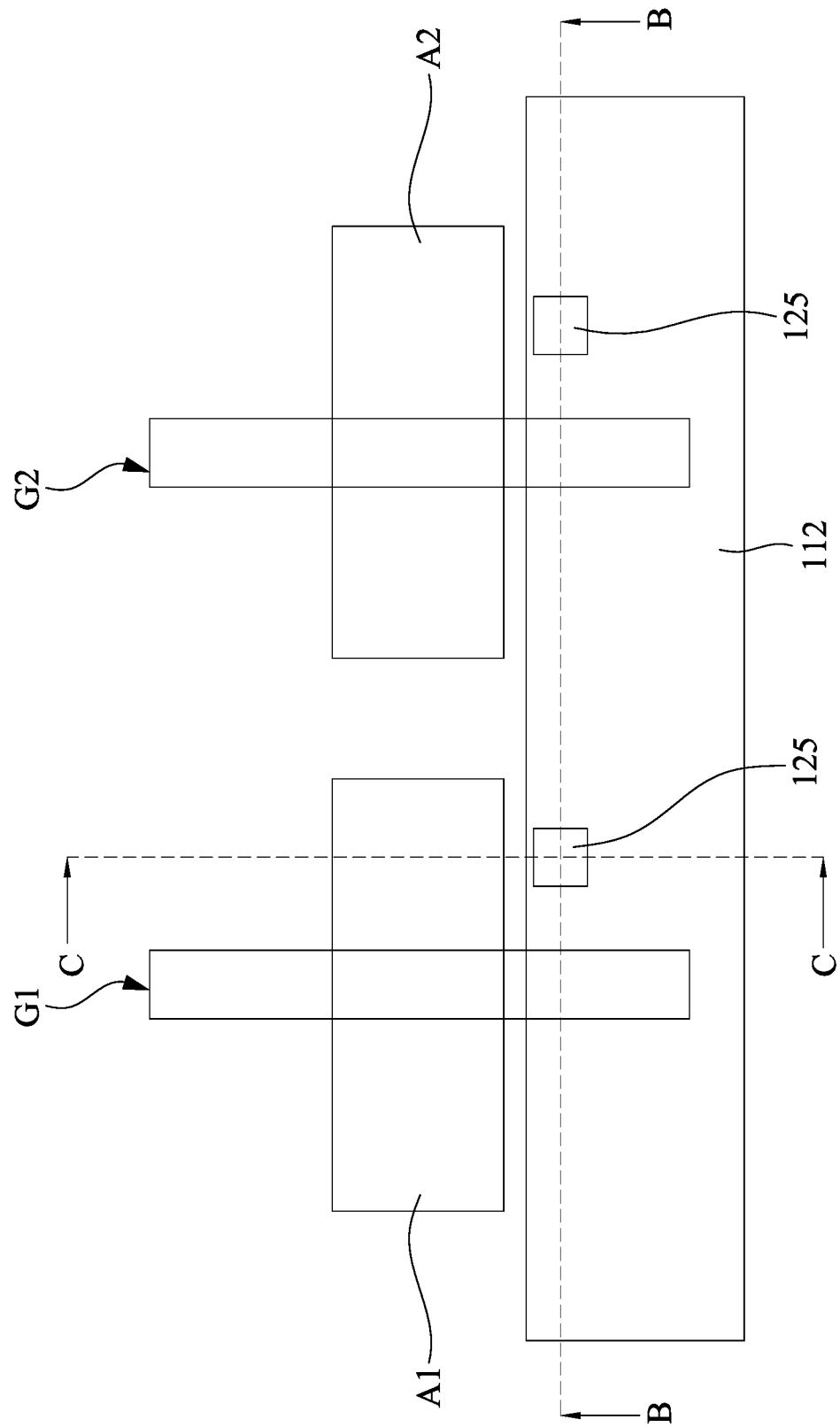
Figure 8B:
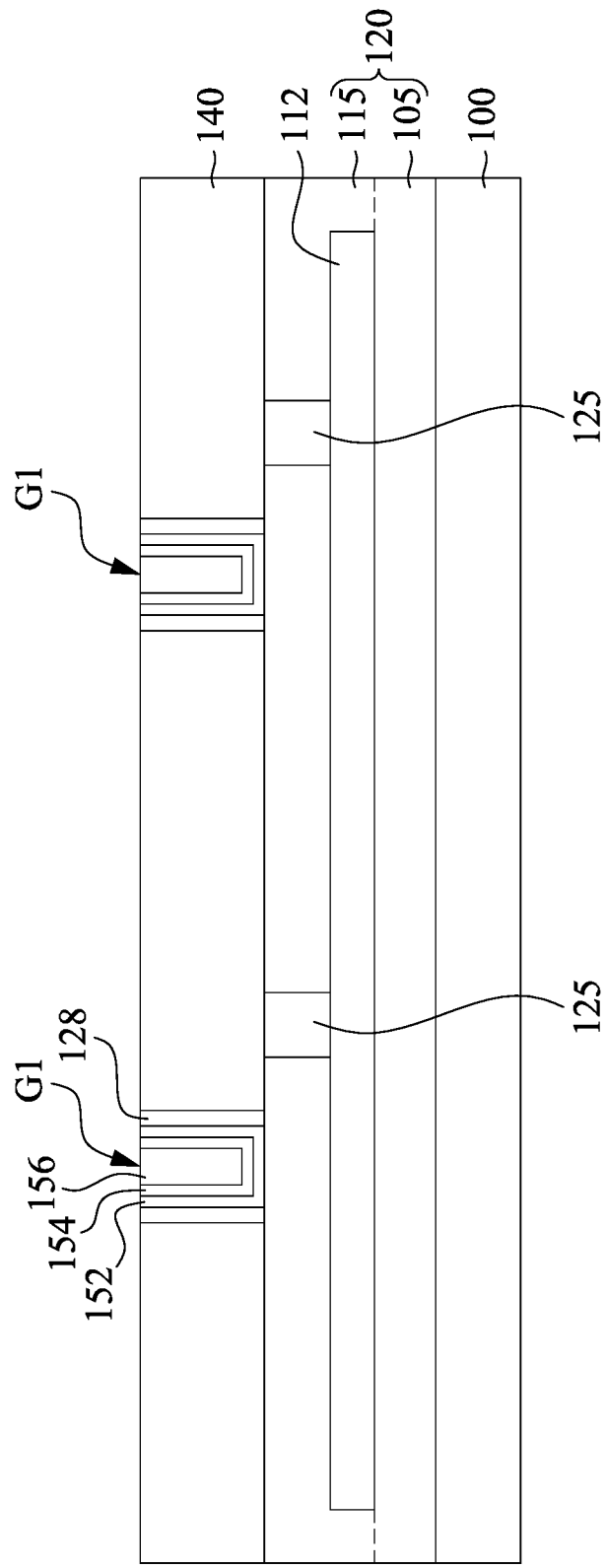
Figure 8C:
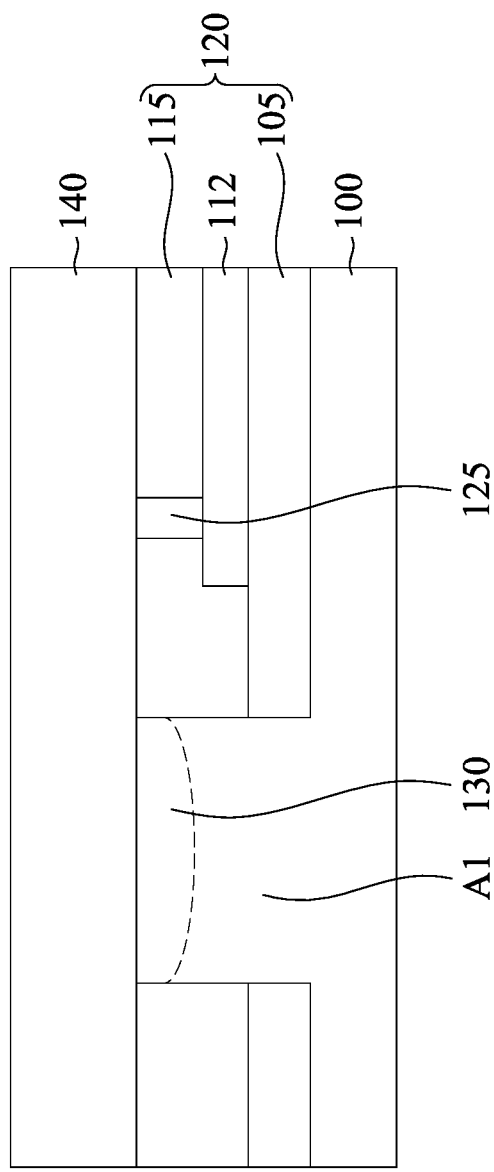

Reference is made to FIGS. 8A to 8C, in which FIG. 8A is a top view of a semiconductor device, FIG. 8B is a cross-sectional view of line B-B of FIG. 8A, and FIG. 8C is a cross-sectional view of line C-C of FIG. 8A. The dummy gate structures DG1 and DG2 are replaced with metal gate structures G1 and G2. Accordingly, the active region A1, the metal gate structure G1, and the source/drain regions 130 on opposite sides of the metal gate structure G1 may form a first transistor T1. On the other hand, the active region A2, the metal gate structure G2, and the source/drain regions 130 on opposite sides of the metal gate structure G1 may form a second transistor T2.

In some embodiments, each of the gate structures G1 and G2 includes a gate dielectric layer 152, a work function metal layer 154, and a filling metal 156. For example, the dummy gate structures DG1 and DG2 are removed by an etching process to form gate trenches between the gate spacers 128, a gate dielectric material, a work function metal material, and a conductive material are formed sequentially in the gate trenches, followed by a CMP process to remove excessive materials of the gate dielectric material, the work function metal material, and the conductive material until the ILD layer 140 is exposed.

In some embodiments, the gate dielectric layers 152 of gate structures G1 and G2 may be made of high-k dielectric materials, such as metal oxides, transition metal-oxides, or the like. Examples of the high-k dielectric material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. In some embodiments, the gate dielectric layers 152 are oxide layers. The gate dielectric layers 152 may be formed by a deposition processes, such as chemical vapor deposition (CVD), physical vapor deposition (PVD), atomic layer deposition (ALD), plasma enhanced CVD (PECVD) or other suitable techniques.

In some embodiments, the work function metal layers 154 of the gate structures G1 and G2 may be an n-type or p-type work function layers. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function metal layers 154 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

In some embodiments, the filling metals 156 may include tungsten (W). In some other embodiments, the filling metals 156 include aluminum (Al), copper (Cu) or other suitable conductive material. The filling metals 156 can be formed by suitable process, such as ALD, CVD, PVD, remote plasma CVD (RPCVD), plasma enhanced CVD (PECVD), metal organic CVD (MOCVD), sputtering, plating, other suitable processes, or combinations thereof.

Figure 9A:
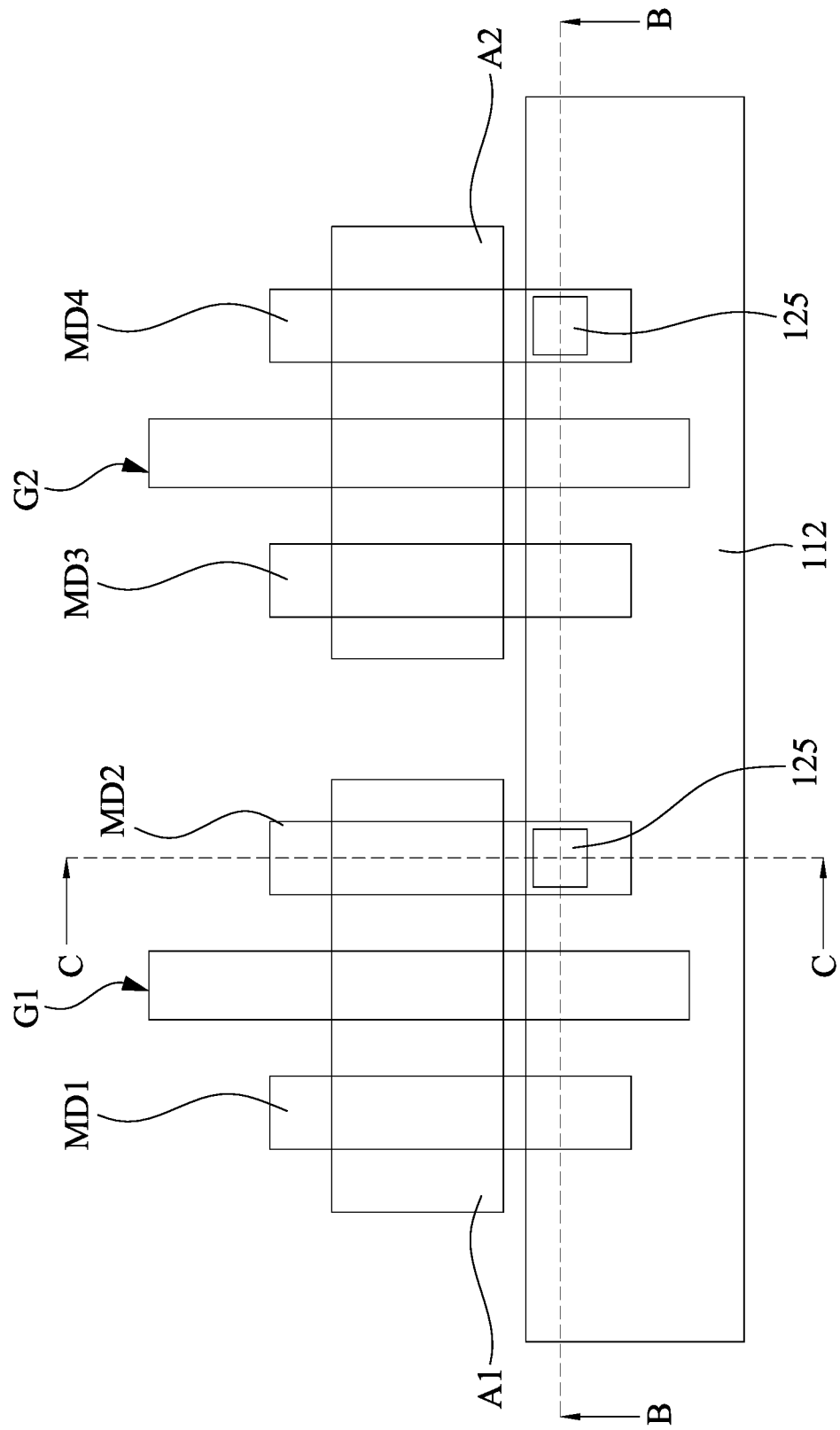
Figure 9B:
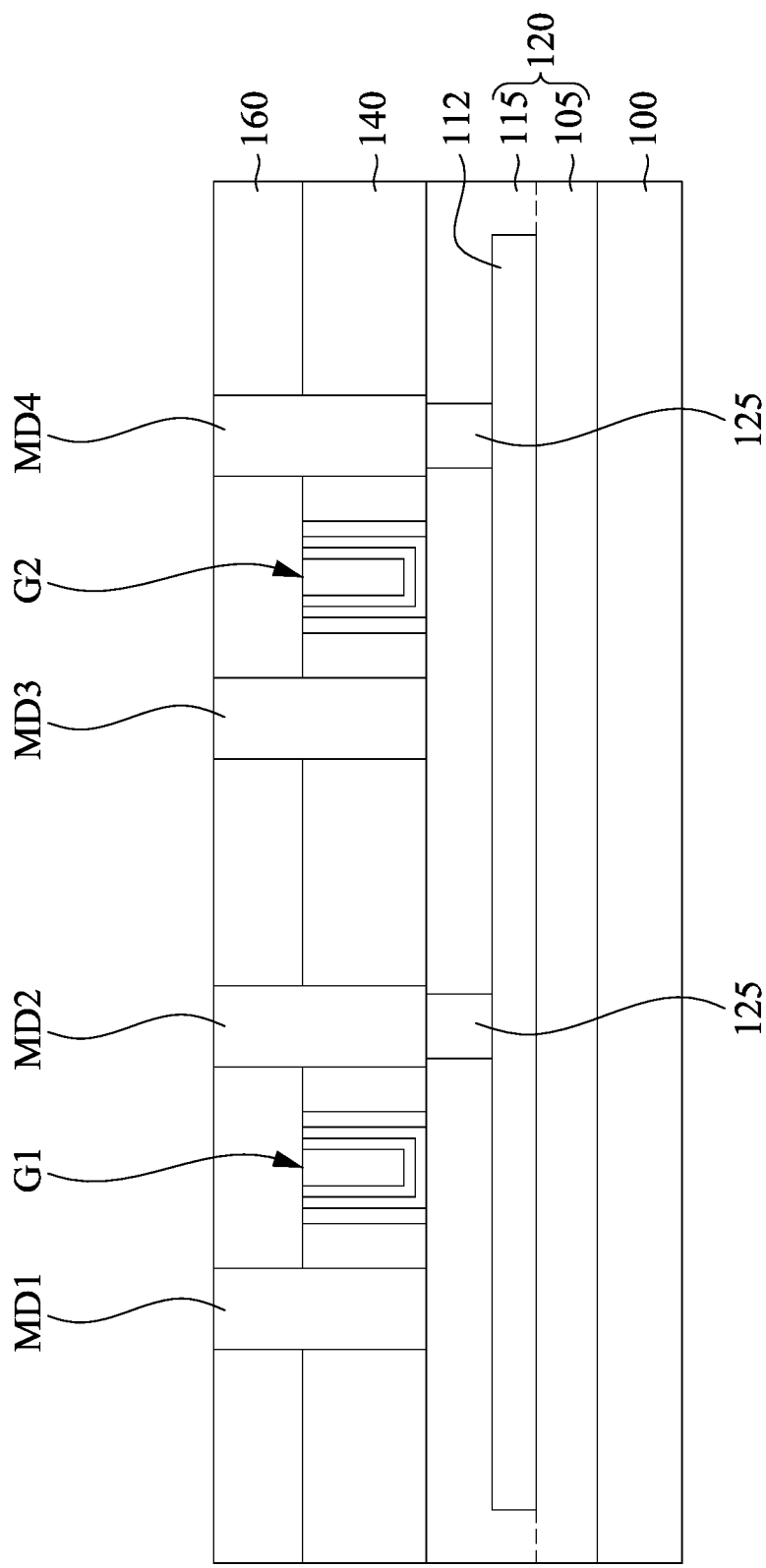
Figure 9C:
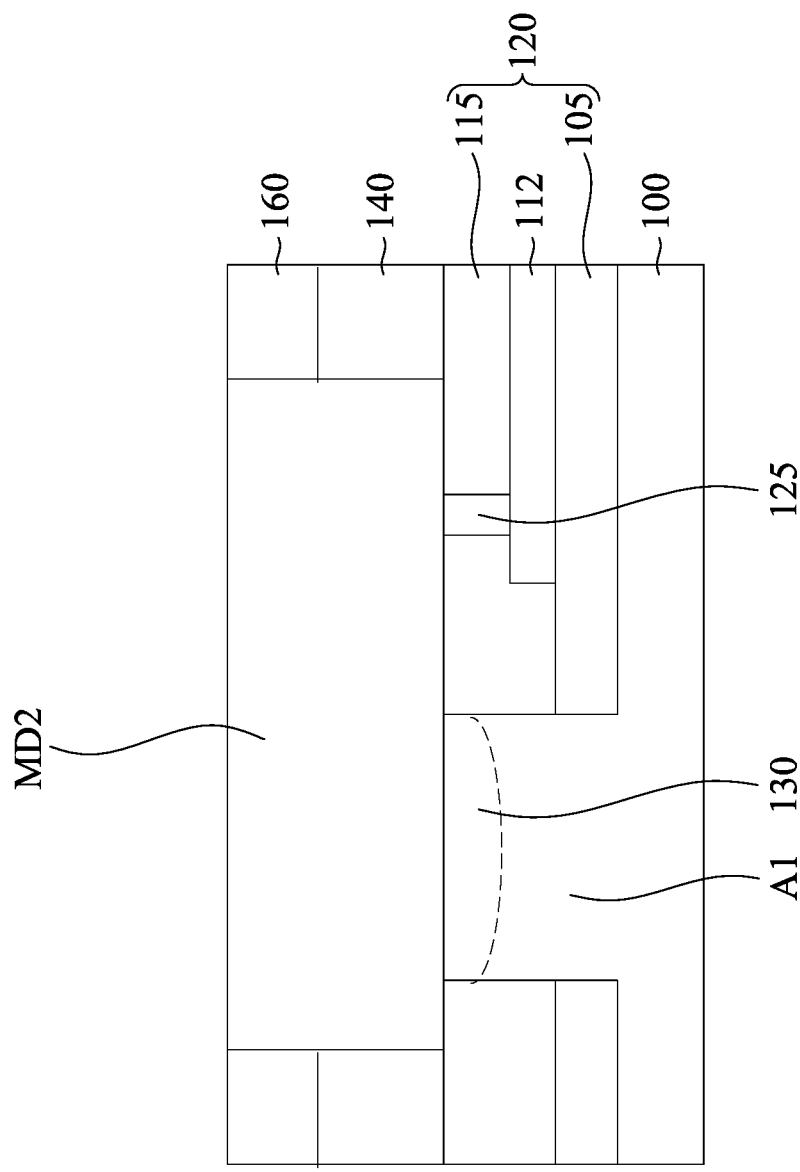

Reference is made to FIGS. 9A to 9C, in which FIG. 9A is a top view of a semiconductor device, FIG. 9B is a cross-sectional view of line B-B of FIG. 9A, and FIG. 9C is a cross-sectional view of line C-C of FIG. 9A. An interlayer dielectric layer (ILD) 160 is deposited over the ILD layer 140 and the metal gate structures G1 and G2. The material and the formation method of the ILD layer 160 are similar to those of the ILD layer 140, and thus relevant details will not be repeated for brevity.

Then, a plurality of source/drain contacts MD1, MD2, MD3, and MD4 are formed in the ILD layers 140 and 160. The source/drain contacts MD1 and MD2 are disposed over the active region A1 and on opposite sides of the metal gate structure G1, and the source/drain contacts MD3 and MD4 are disposed over the active region A2 and on opposite sides of the metal gate structure G2. In some embodiments, the source/drain contact MD2 is in contact with the conductive vias 125, and the source drain contact MD4 is in contact with the conductive vias 125.

In some embodiments, the source/drain contacts MD1-MD4 may be formed by, for example, patterning the ILD layers 140 and 160 to form openings extending through the ILD layers 140 and 160, filling contact material in the openings, and followed by a CMP process to remove excessive contact material until the top surface of the ILD layer 160 is exposed. It is noted that, after patterning the ILD layers 140 and 160, portions of the openings expose the top surfaces of the conductive vias 125, while other portions of the openings expose the top surfaces of the isolation structure 120.

In some embodiments, each of the source/drain contact MD1-MD4 includes a liner and a plug. In some embodiments, the liner assists with the deposition of plug and helps to reduce diffusion of a material of plug through the ILD layers 140 and 160. In some embodiments, the liner includes titanium (Ti), titanium nitride (TiN), tantalum (Ta), tantalum nitride (TaN), or another suitable material. The Plug includes a conductive material, such tungsten (W), copper (Cu), aluminum (Al), ruthenium (Ru), cobalt (Co), molybdenum (Mo), nickel (Ni), or other suitable conductive material.

Figure 10A:
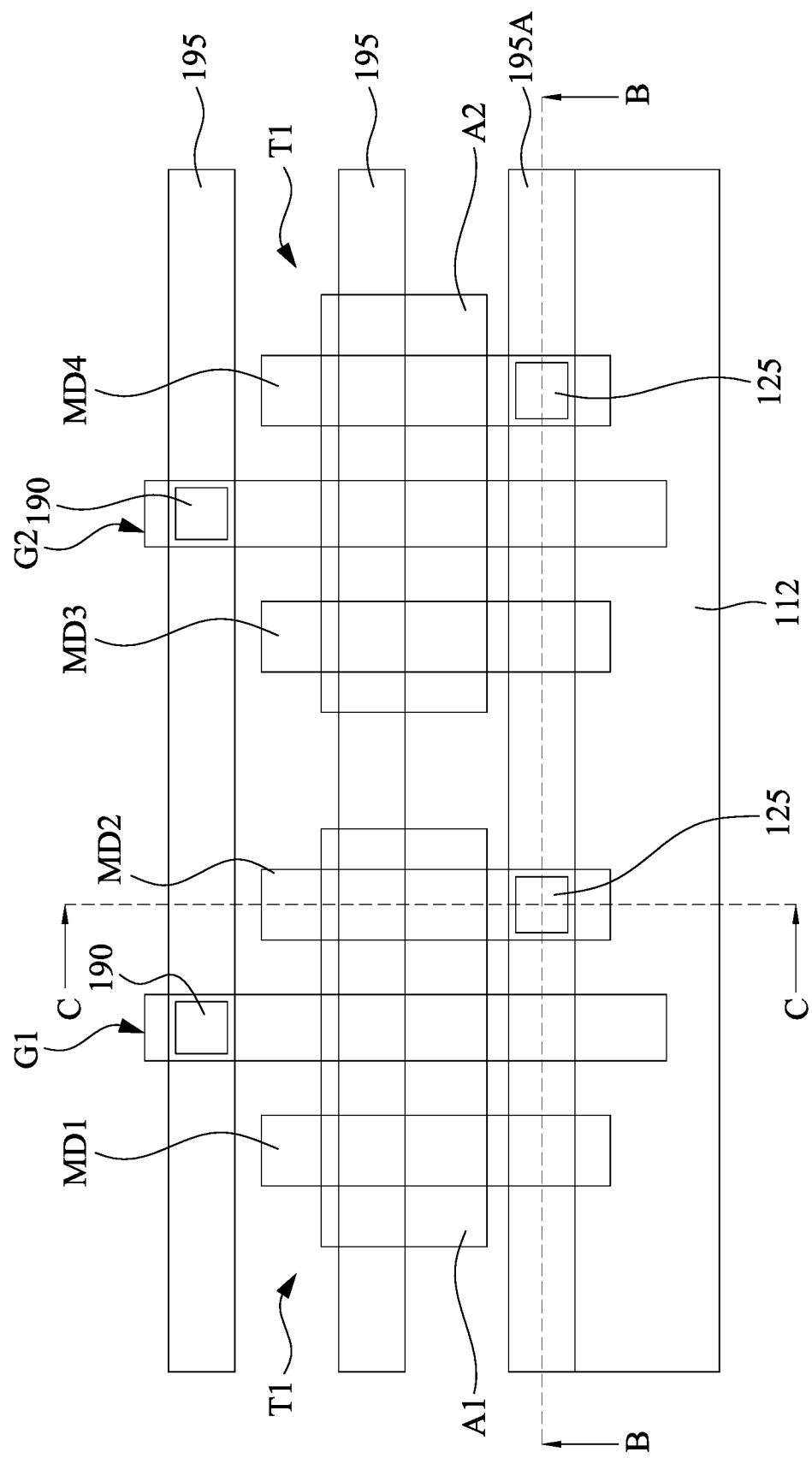
Figure 10B:
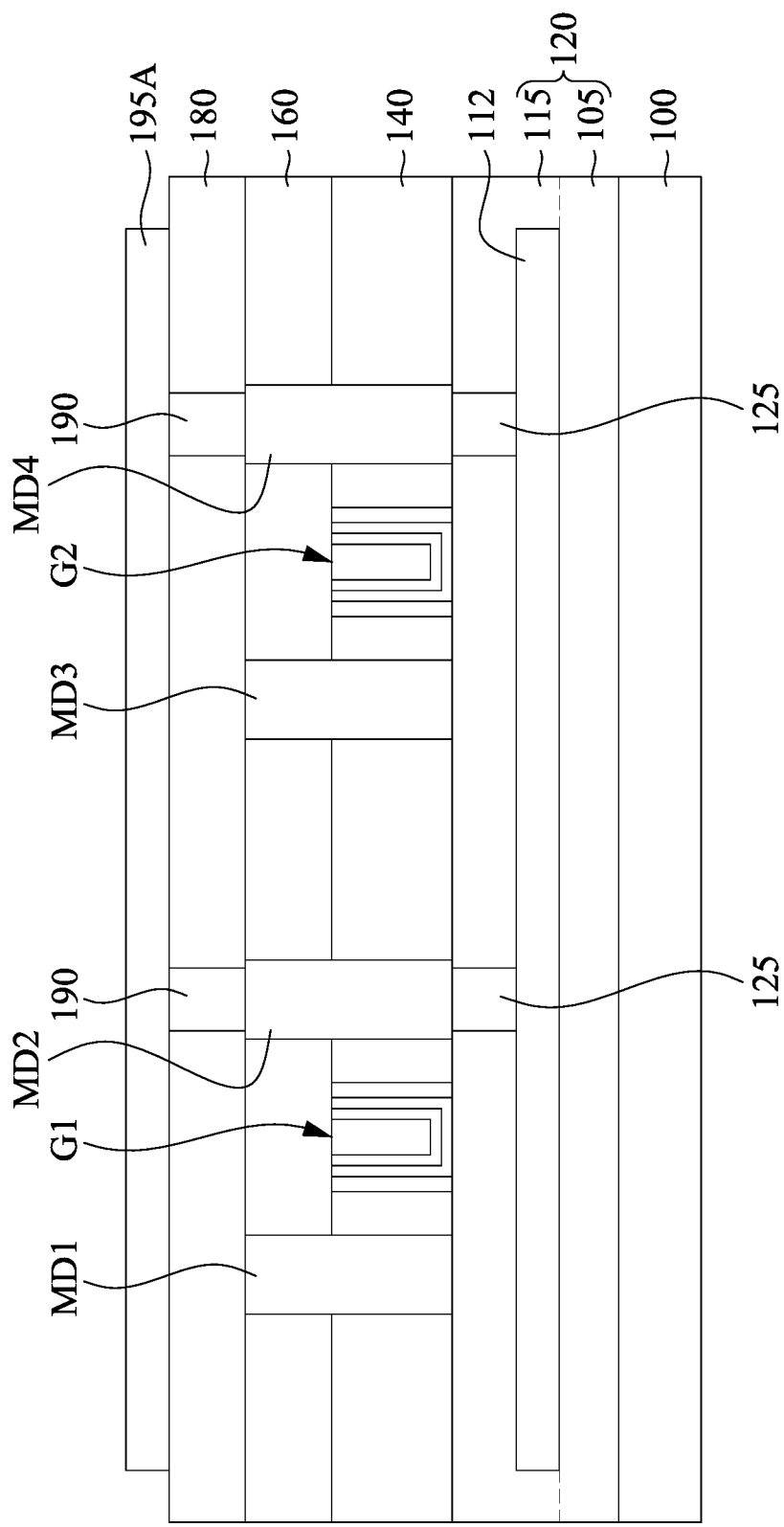
Figure 10C:
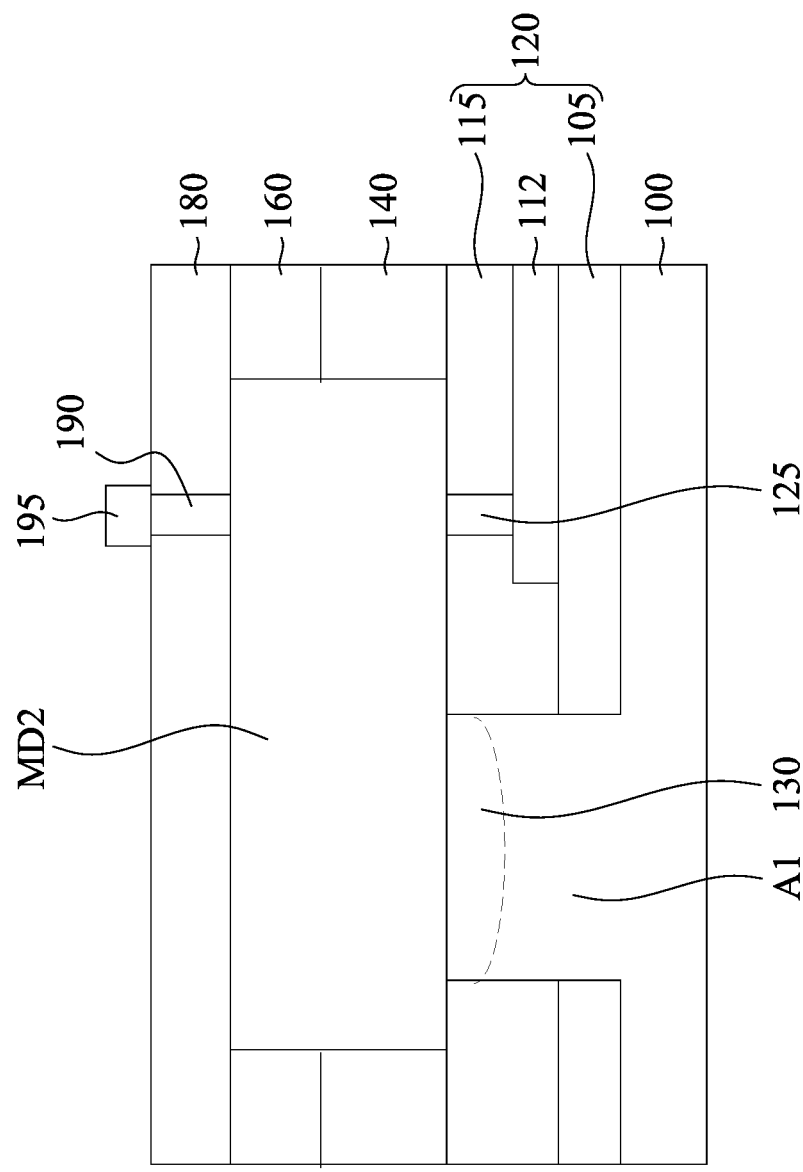

Reference is made to FIGS. 10A to 10C, in which FIG. 10A is a top view of a semiconductor device, FIG. 10B is a cross-sectional view of line B-B of FIG. 10A, and FIG. 10C is a cross-sectional view of line C-C of FIG. 10A. An interlayer dielectric layer (ILD) 180 is deposited over the ILD layer 160 and the source/drain contact. MD1 and MD2. The material and the formation method of the ILD layer 180 are similar to those of the ILD layer 140, and thus relevant details will not be repeated for brevity.

Then, a plurality of conductive vias 190 are formed in the ILD layer 180. In some embodiments, the conductive vias 190 may be formed by, for example, patterning the ILD layer 180 to form openings extending through the ILD layer 180 and exposing the metal gate structures G1, G2 and the source/drain contacts MD2, MD4, filling conductive material in the openings, and followed by a CMP process to remove excessive conductive material until the top surface of the ILD layer 180 is exposed.

Then, a plurality of metal lines 195 are formed over the ILD layer 180. In some embodiments, the metal lines 195 may be formed by, for example, depositing a metal layer over the ILD layer 180, and patterning the metal layer via photolithography process.

The conductive vias 190 are in contact with the top surfaces of the source/drain contacts MD2 and MD4, respectively. On the other hand, the metal line 195 is in contact with the conductive vias 190. That is, the conductive vias 190 and the metal line 195 electrically connect the source/drain contact MD2 of the first transistor T1 to the source/drain contact MD2 of the second transistor T2. Similarly, the conductive vias 125 are in contact with the bottom surfaces of the source/drain contacts MD2 and MD4, respectively. The metal line 112 is in contact with the conductive vias 125. That is, the conductive vias 125 and the metal line 112 electrically connect the source/drain contact MD2 of the first transistor T1 to the source/drain contact MD2 of the second transistor T2. As shown in FIG. 10A, when view from above (in a plane view), along the direction perpendicular to the top surface of the substrate 100, the metal line 112 vertically overlaps one of the metal line 195. On the other hands, the conductive vias 190 vertically overlap the corresponding conductive vias 125.

In some embodiments of the present disclosure, the source/drain contact MD2 can be electrically connected to the source/drain contact MD4 via two current paths, which will lower the electrical conductance between the source/drain contacts MD2 and MD4, and the device performed will be improved accordingly. On the other hand, the metal line 112 vertically overlaps one of the metal line 195 along the direction perpendicular to the top surface of the substrate 100. If the metal line 112 and the metal line 195 are at the same layer, more area will be needed to place the two metal lines. Accordingly, with this configuration, the spacer can be reduced to increase the cell density, and the routing flexibility can also be improved.

Figure 11A:
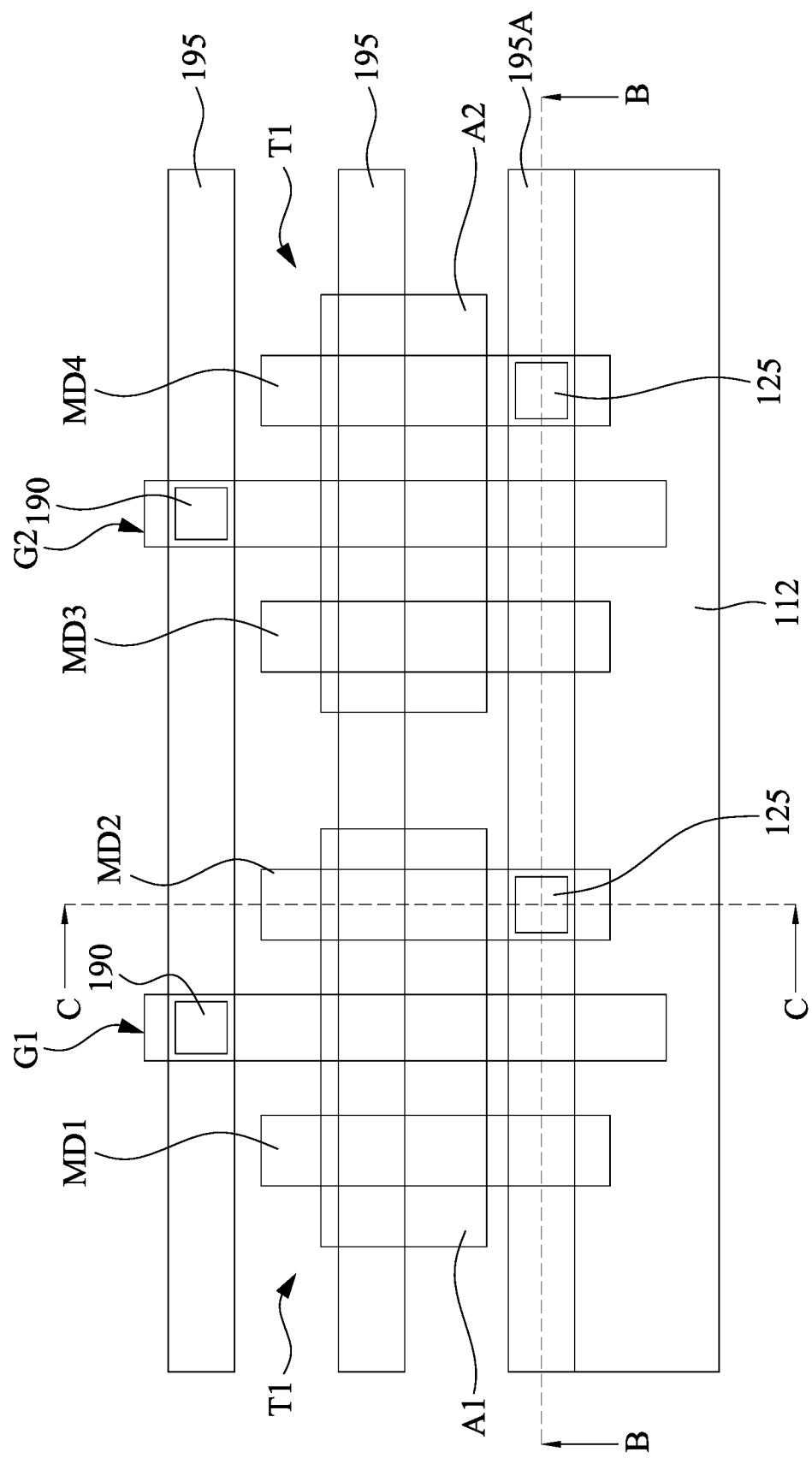
FIGS. 11A to 11C illustrate a semiconductor device in accordance with some embodiments of the present disclosure.
Figure 11B:
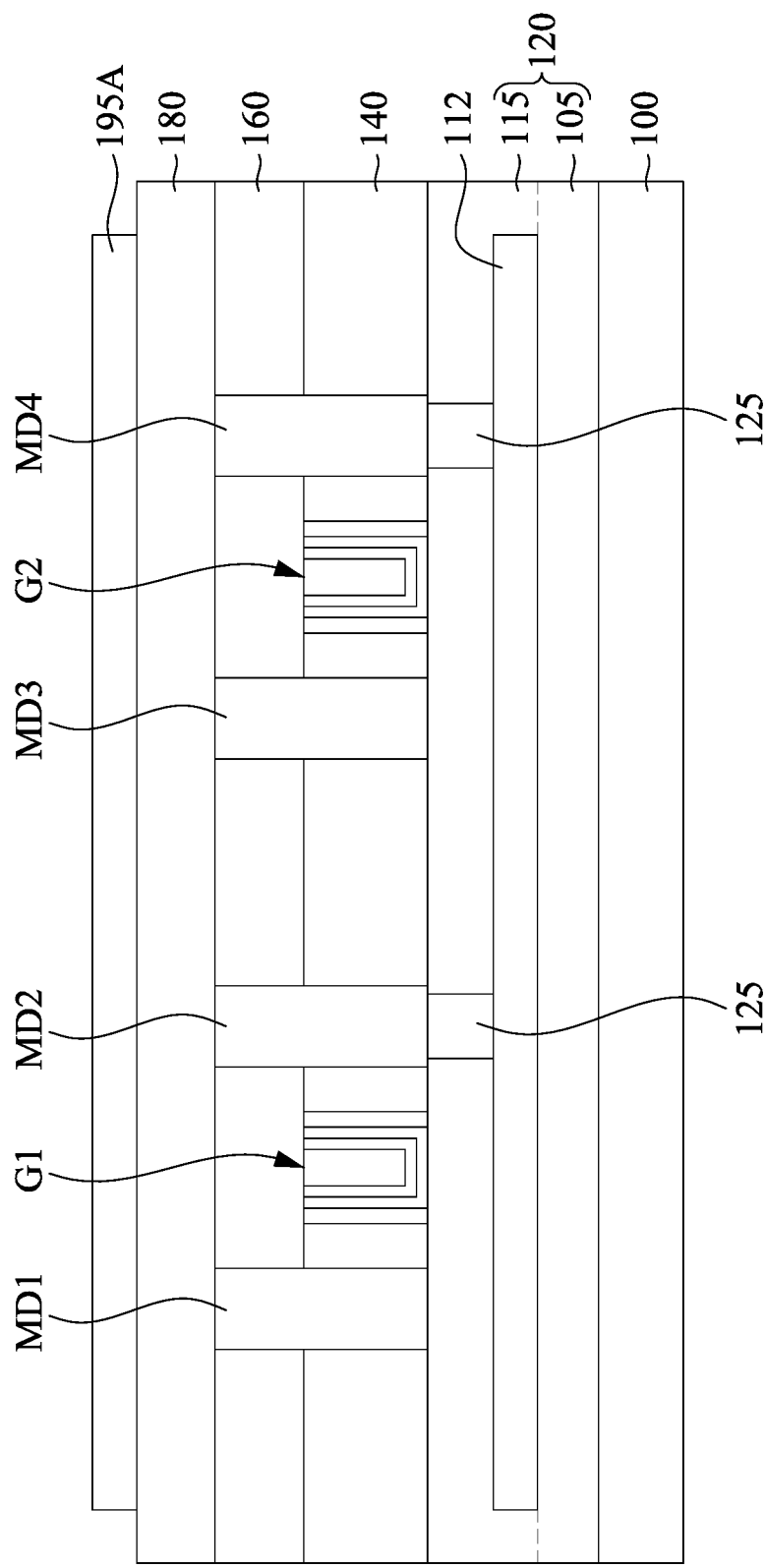
Figure 11C:
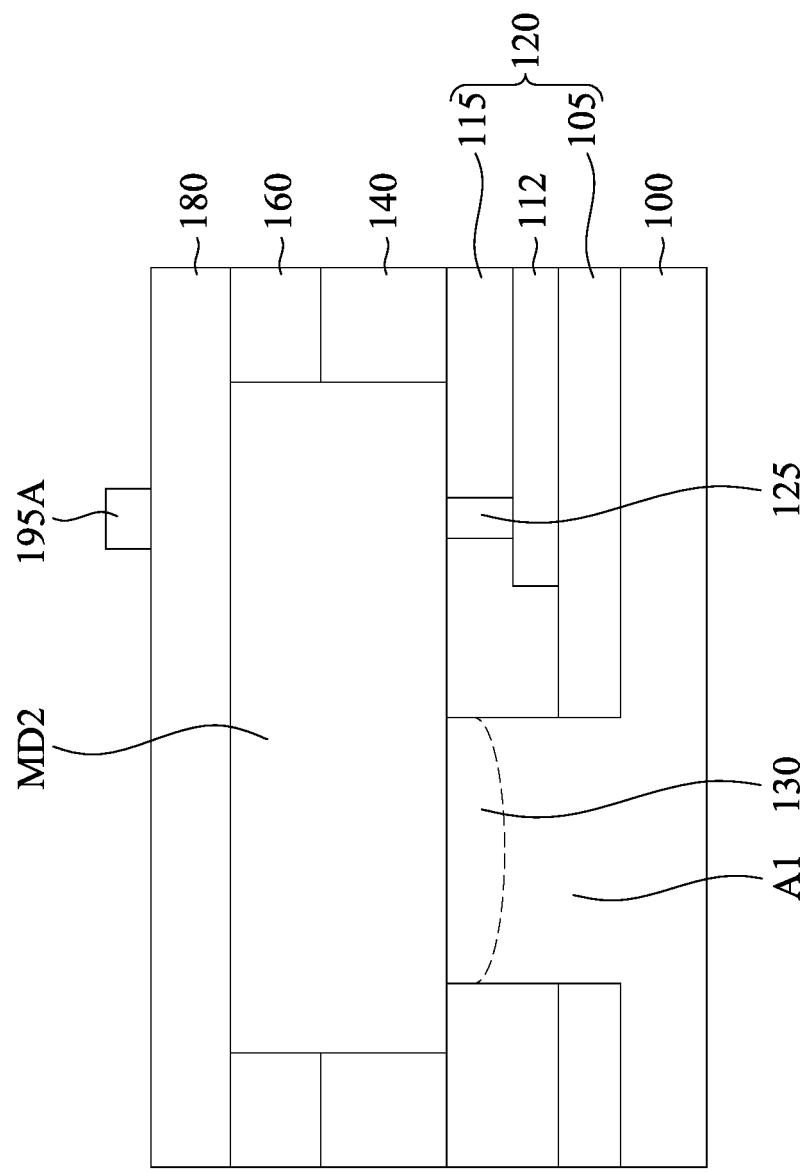

Reference is made to FIGS. 11A to 11C, in which FIG. 11A is a top view of a semiconductor device, FIG. 11B is a cross-sectional view of line B-B of FIG. 11A, and FIG. 11C is a cross-sectional view of line C-C of FIG. 11A. Some elements of FIGS. 11A to 11C are similar to those of FIGS. 10A to 10C, these elements are labeled the same, and relevant details will not be repeated for simplicity.

In FIGS. 11A to 11C, a metal line 195A is disposed over the ILD layer 180, and the metal line 195A vertically overlaps the metal line 112 along the direction perpendicular to the top surface of the substrate 100. FIGS. 11A to 11C are different from FIGS. 10A to 10C, in that there is no conductive via in the ILD layer 180 that connects the metal line 195A to the source/drain contacts MD2 and MD4. Stated another way, the ILD layer 180 is free from conductive material that is in contact with the top surfaces of the source/drain contacts MD2 and MD4 and the bottom surface of the metal line 195A. That is, only the bottom surfaces of the source/drain contacts MD2 and MD4 are in contact with conductive vias 125, and the conductive vias 125 and the metal line 112 in the isolation structure 120 electrically connect the source/drain contact MD2 to the source/drain contact MD4. As a result, the conductive vias 125 and the metal line 112 form the shortest electrical conductive path between the source/drain contacts MD2 and MD4. In some embodiments, the entire metal line 195A may vertically overlap the metal line 112 along the vertical direction. In some other embodiments, parts of the metal line 195A may vertically overlap the metal line 112 along the vertical direction.

In some embodiments, the metal line 112 may serve as a power bus (Vdd) for the transistors T1 and T2. On the other hand, the metal line 195A that vertically overlaps the metal line 112 may provide other circuit function of the semiconductor device. If the metal line 112 and the metal line 195A are at the same layer, more area will be needed to place the two metal lines. Accordingly, with this configuration, the spacer can be reduced to increase the cell density, and the routing flexibility can also be improved.

Figure 12A:
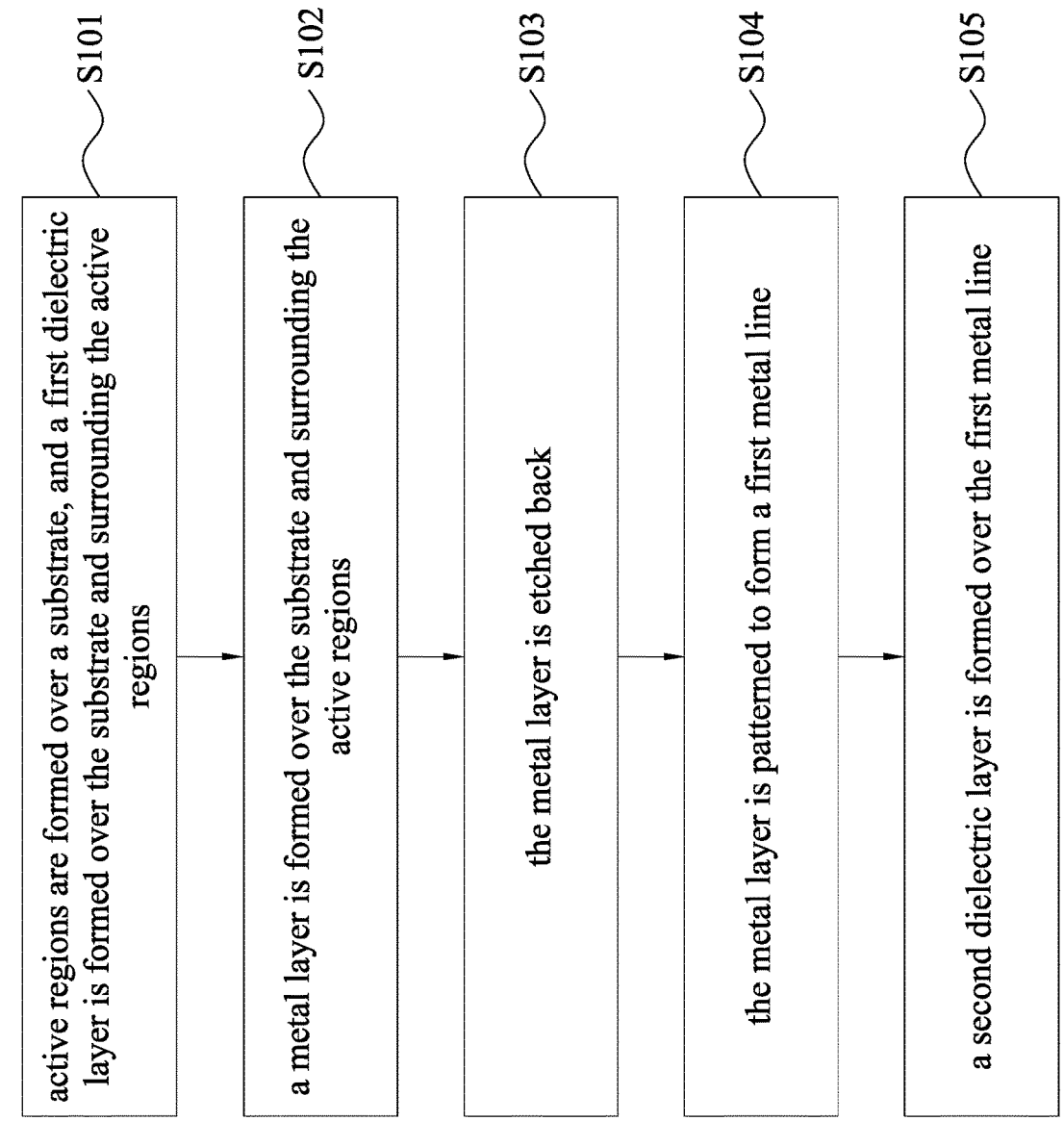
FIGS. 12A and 12B are a method of manufacturing a memory device in accordance with some embodiments of the present disclosure.
Figure 12B:
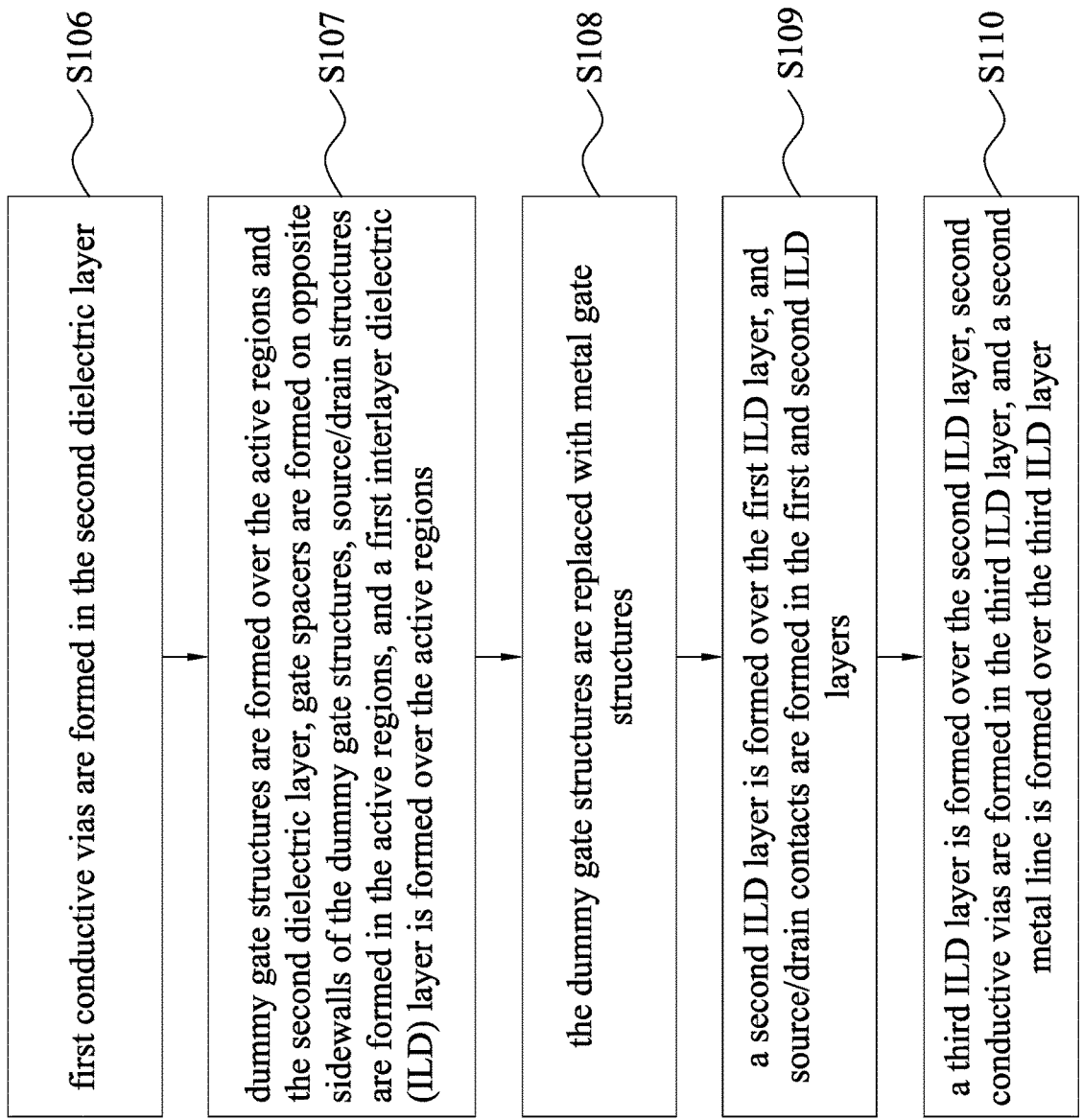

FIGS. 12A and 12B are a method M1 of manufacturing a memory device in accordance with some embodiments of the present disclosure. Although the method M1 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At block S101, active regions are formed over a substrate, and a first dielectric layer is formed over the substrate and surrounding the active regions. FIGS. 1A to 1C illustrate schematic views of some embodiments corresponding to act in block S101.

At block S102, a metal layer is formed over the substrate and surrounding the active regions. FIGS. 2A to 2C illustrate schematic views of some embodiments corresponding to act in block S102.

At block S103, the metal layer is etched back. FIGS. 3A to 3C illustrate schematic views of some embodiments corresponding to act in block S103.

At block S104, the metal layer is patterned to form a first metal line. FIGS. 4A to 4C illustrate schematic views of some embodiments corresponding to act in block S104.

At block S105, a second dielectric layer is formed over the first metal line. FIGS. 5A to 5C illustrate schematic views of some embodiments corresponding to act in block S105.

At block S106, first conductive vias are formed in the second dielectric layer, FIGS. 6A to 6C illustrate schematic views of some embodiments corresponding to act in block S106.

At block S107, dummy gate structures are formed over the active regions and the second dielectric layer, gate spacers are formed on opposite sidewalls of the dummy gate structures, source/drain structures are formed in the active regions, and a first interlayer dielectric (ILD) layer is formed over the active regions. FIGS. 7A to 7C illustrate schematic views of some embodiments corresponding to act in block S107.

At block S108, the dummy gate structures are replaced with metal gate structures. FIGS. 8A to 8C illustrate schematic views of some embodiments corresponding to act in block S108.

At block S109, a second ILD layer is formed over the first ILD layer, and source/drain contacts are formed in the first and second ILD layers. FIGS. 9A to 9C illustrate schematic views of some embodiments corresponding to act in block S109.

At block S110, a third ILD layer is formed over the second ILD layer, second conductive vias are formed in the third ILD layer, and a second metal line is formed over the third ILD layer. FIGS. 10A to 10C illustrate schematic views of some embodiments corresponding to act in block S110.

FIGS. 13A to 17B illustrate a method in various stages of fabricating a semiconductor device in accordance with some embodiments of the present disclosure. It is noted that some elements of FIGS. 13A to 17B are similar to those described in FIGS. 10A to 10C, these elements are labeled the same, and relevant details will not be repeated for brevity.

Figure 13B:
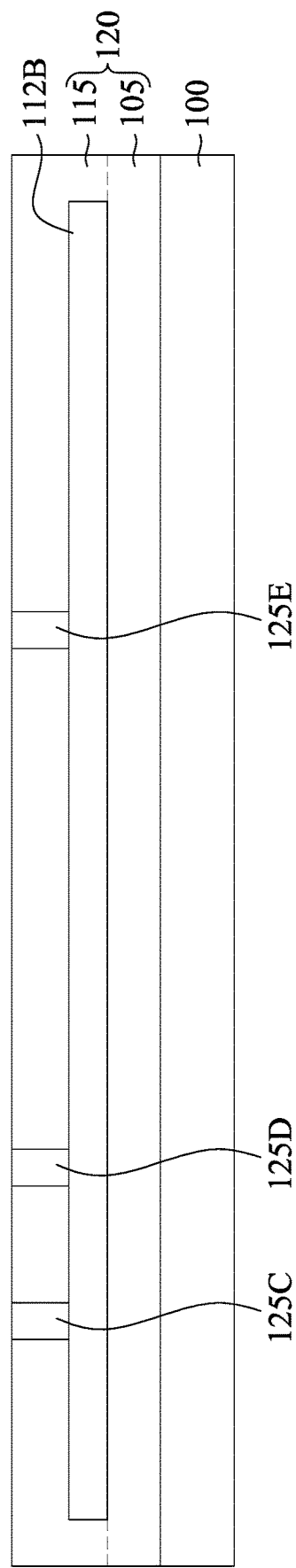
FIGS. 13A to 17B illustrate a method in various stages of fabricating a semiconductor device in accordance with some embodiments of the present disclosure.

Reference is made to FIGS. 13A and 13B, in which FIG. 13A is a top view of a semiconductor device, and FIG. 13B is a cross-sectional view of line B-B of FIG. 13A. Shown there is a substrate 100. Active regions A1 and A2 are formed over the substrate 100. An isolation structure 120 is disposed over the substrate 100, in which the isolation structure 120 may include a dielectric layer 105 and a dielectric layer 115 over the dielectric layer 105. Metal lines 112A, 112B, and 112C are embedded in the isolation structure 120. In some embodiments, bottom surfaces of the metal lines 112A to 112C and the top surface of the dielectric layer 105 are coterminous. The metal lines 112A to 112C are similar to the metal line 112 of FIGS. 10A to 10C. Conductive vias 125A to 125G are formed in the isolation structure 120 and contacting the corresponding metal lines 112A to 112C. For example, conductive vias 125A and 125B are in contact with the metal line 112A, the conductive vias 125C, 125D, and 125E are in contact with the metal line 112B, and the conductive vias 125E and 125G are in contact with the metal line 112C. The conductive vies 125A to 125G are similar to the conductive vias 125 of FIGS. 10A to 10C. It is noted that the formation method of the above mentioned elements are similar to those discussed with respect to FIGS. 1A to 6C.

Figure 14A:
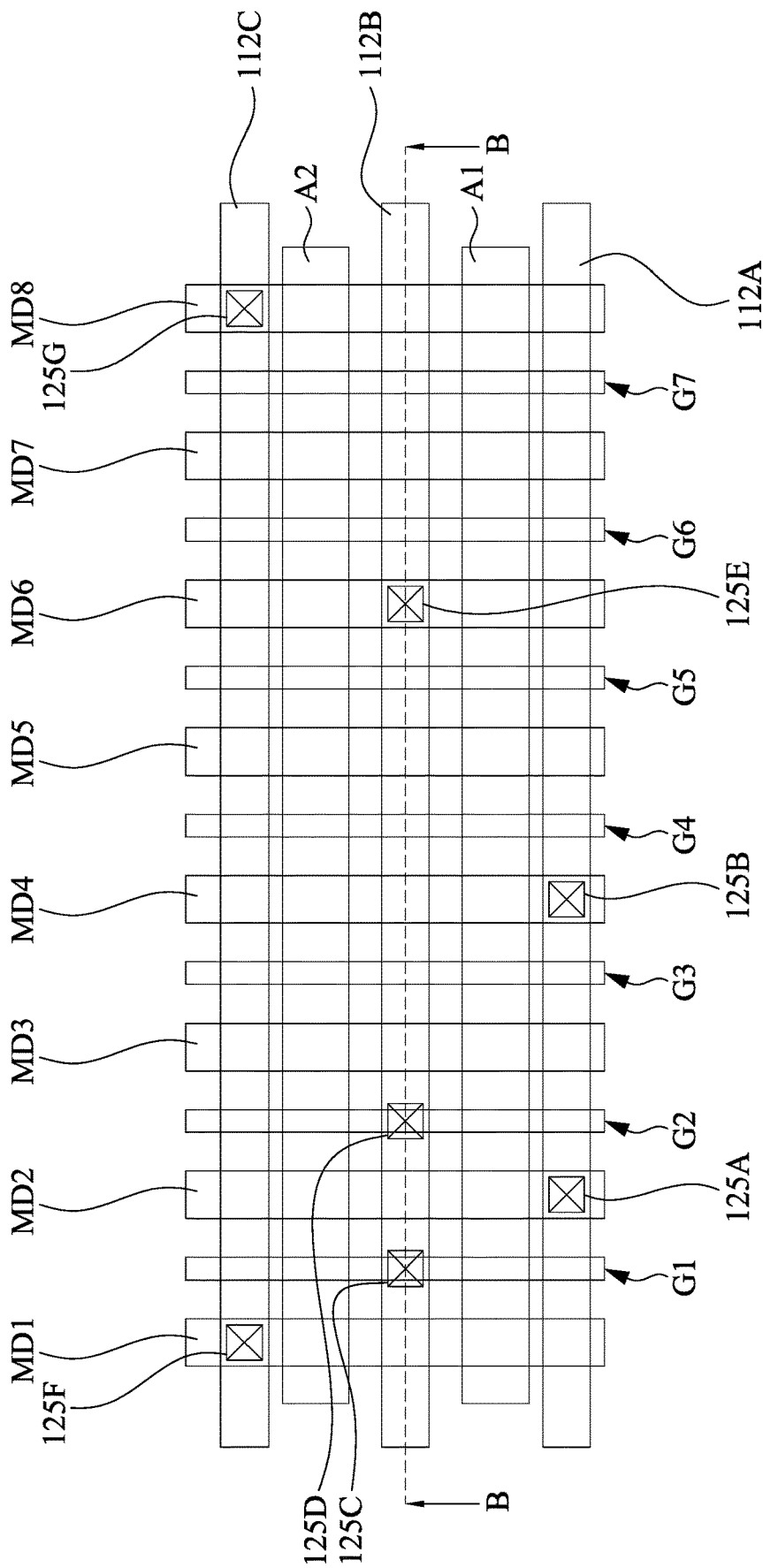
Figure 14B:
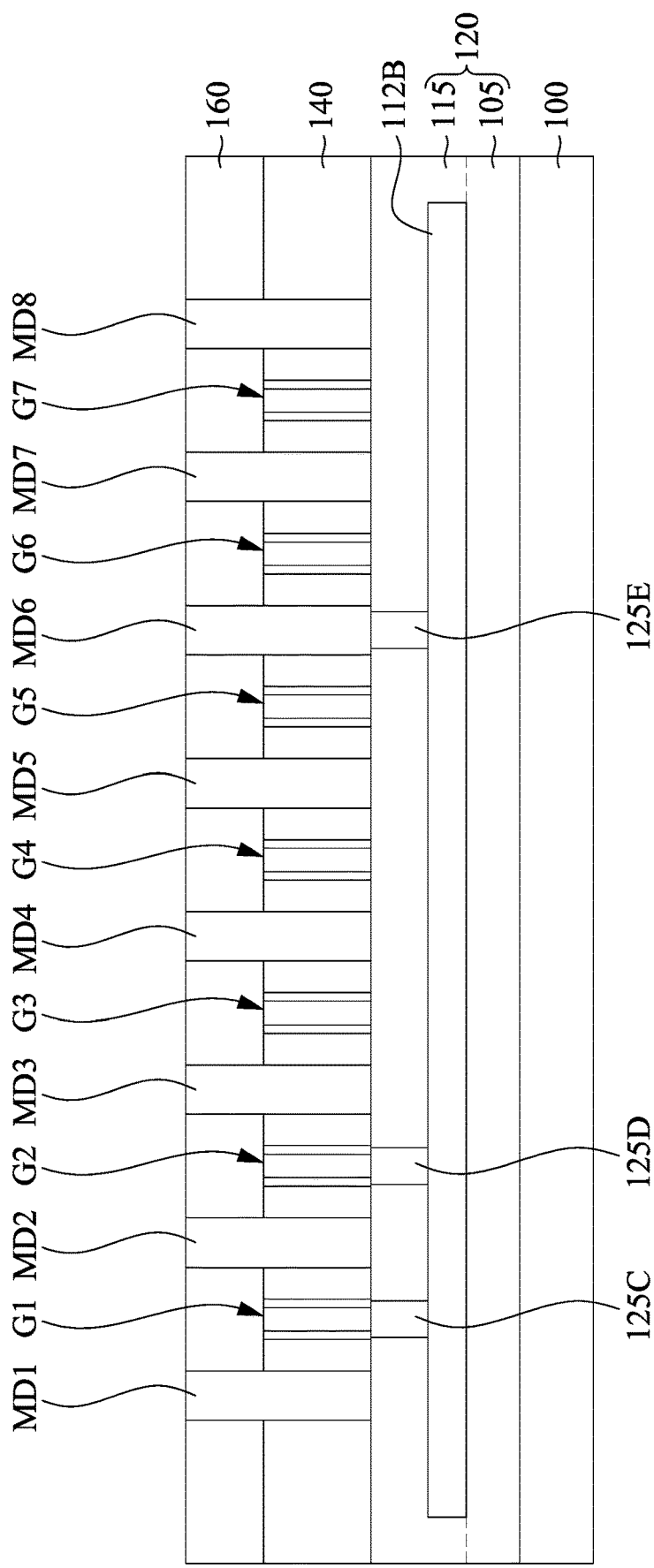

Reference is made to FIGS. 14A and 14B, in which FIG. 14A is a top view of a semiconductor device, and FIG. 14B is a cross-sectional view of line B-B of FIG. 14A. Metal gate structures G1 to G7 are formed over the substrate 100 and cover the active regions A1 and A2. ILD layer 140 is formed over the substrate 100 and adjacent to the metal gate structures G1 to G7. ILD layer 160 is formed over the ILD layer 140. Although not shown, source/drain regions are formed in the active regions A1 and A2, and are formed on opposite sides of the metal gate structures G1 to G7, respectively. Source/drain contacts MD1 to MD8 are formed extending through the ILD layers 140 and 160. It is noted that the formation method of the above mentioned elements are similar to those discussed with respect to FIGS. 7A to 9C.

Referring to FIG. 14A, with respect to the metal line 112A and conductive vias 125A and 125B, the conductive via 125A is in contact with the source/drain contact MD2, the conductive via 125B is in contact with the source/drain contact MD4. Accordingly, source/drain contacts MD2 and MD4 are electrically connected by the conductive vias 125A and 125B and the metal line 112A.

With respect to the metal line 112B and conductive vias 125C, 125D, and 125E, the conductive via 125C is in contact with the metal gate structure G1, the conductive via 125D is in contact with the metal gate structure G2, and the conductive via 125E is in contact with the source/drain contact MD6. Accordingly, metal gate structure G1, metal gate structure G2, and the source/drain contact MD6 are electrically connected by the conductive vias 125C, 125D, and 125E and the metal line 112B.

With respect to the metal line 112C and conductive vias 125F and 125G, the conductive via 125F is in contact with the source/drain contact MD1, the conductive via 125G is in contact with the source/drain contact MD8. Accordingly, source/drain contacts MD1 and MD8 are electrically connected by the conductive vias 125F and 125G and the metal line 112C.

Figure 15A:
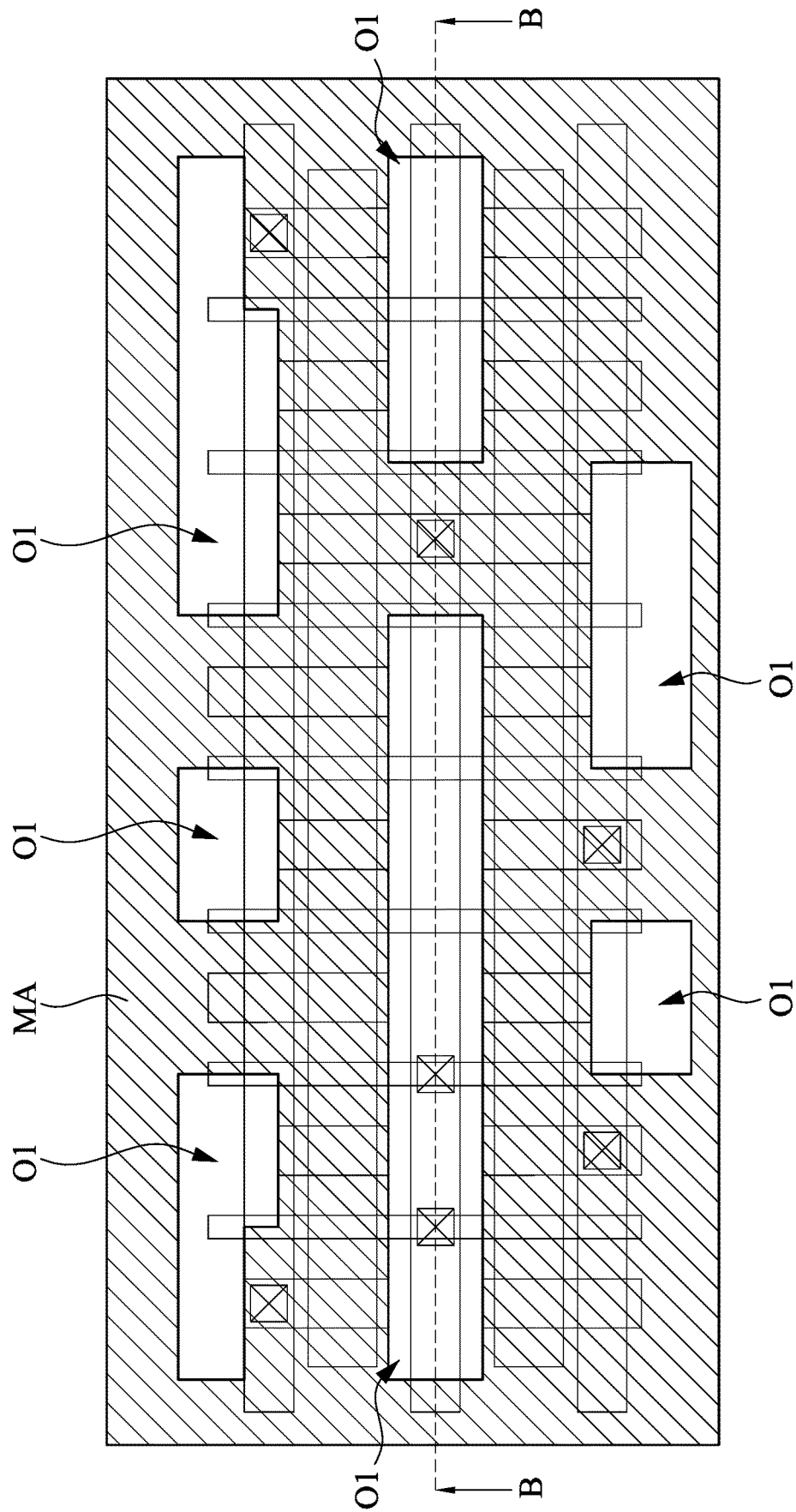
Figure 15B:
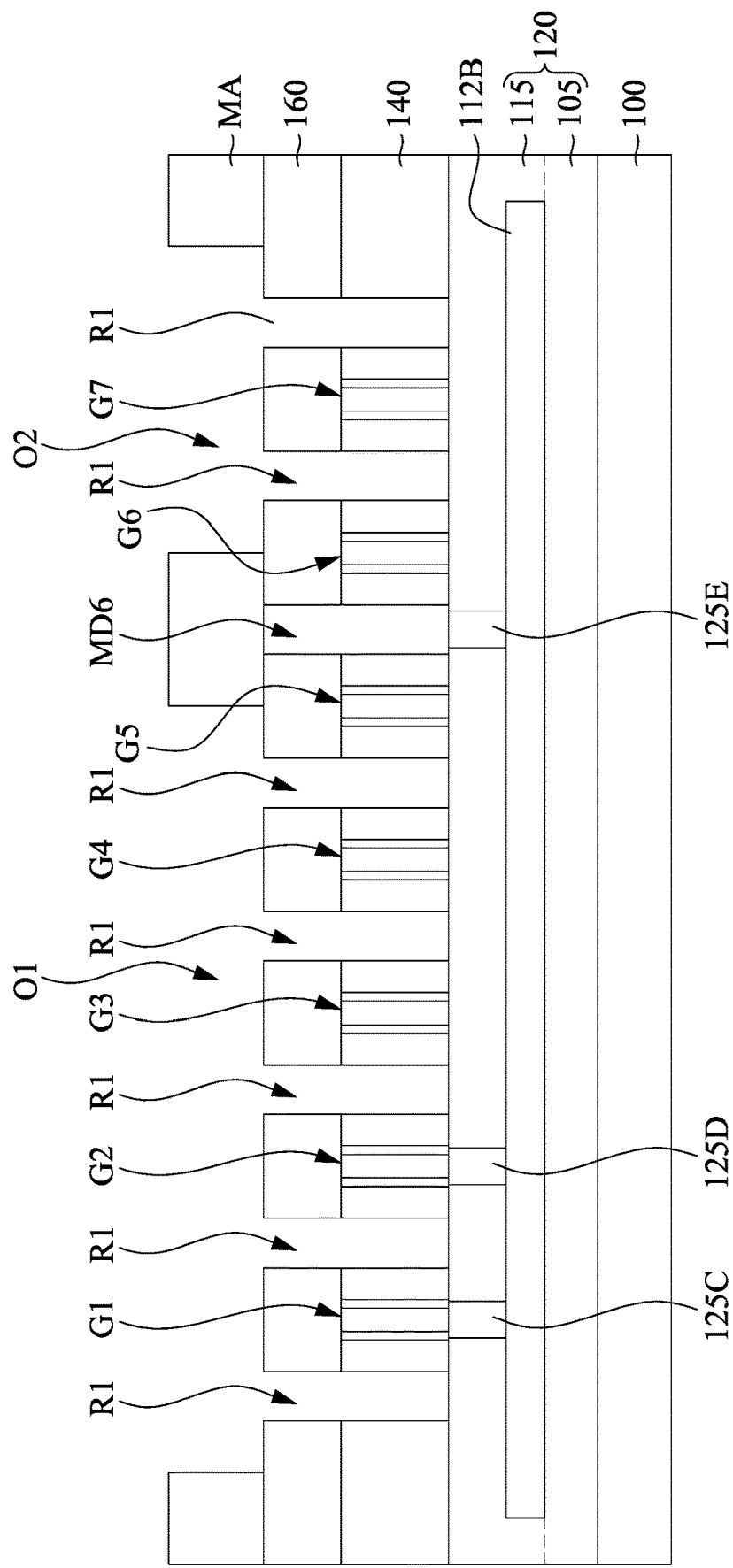

Reference is made to FIGS. 15A and 15B, in which FIG. 15A is a top view of a semiconductor device, and FIG. 15B is a cross-sectional view of line B-B of FIG. 15A. A mask MA is formed over the ILD layer 160, in which the mask MA includes a plurality of openings O1, and the openings O1 expose portions of the source/drain contacts MD1 to MD8. Then, an etching process is performed to remove portions of the source/drain contacts MD1 to MD8 exposed by the openings O1. As an example of the cross-section in FIG. 15B, only the source/drain contact MD7 is covered by the mask MA. Accordingly, portions of the source/drain contacts MD1-MD6 and MD8 are removed by the etching process to form recesses R1 in the ILD layers 140 and 160. In some embodiments, the mask MA may be photoresist layer. In some embodiments, the etching process may be dry etching, wet etching, or combinations thereof.

Figure 16A:
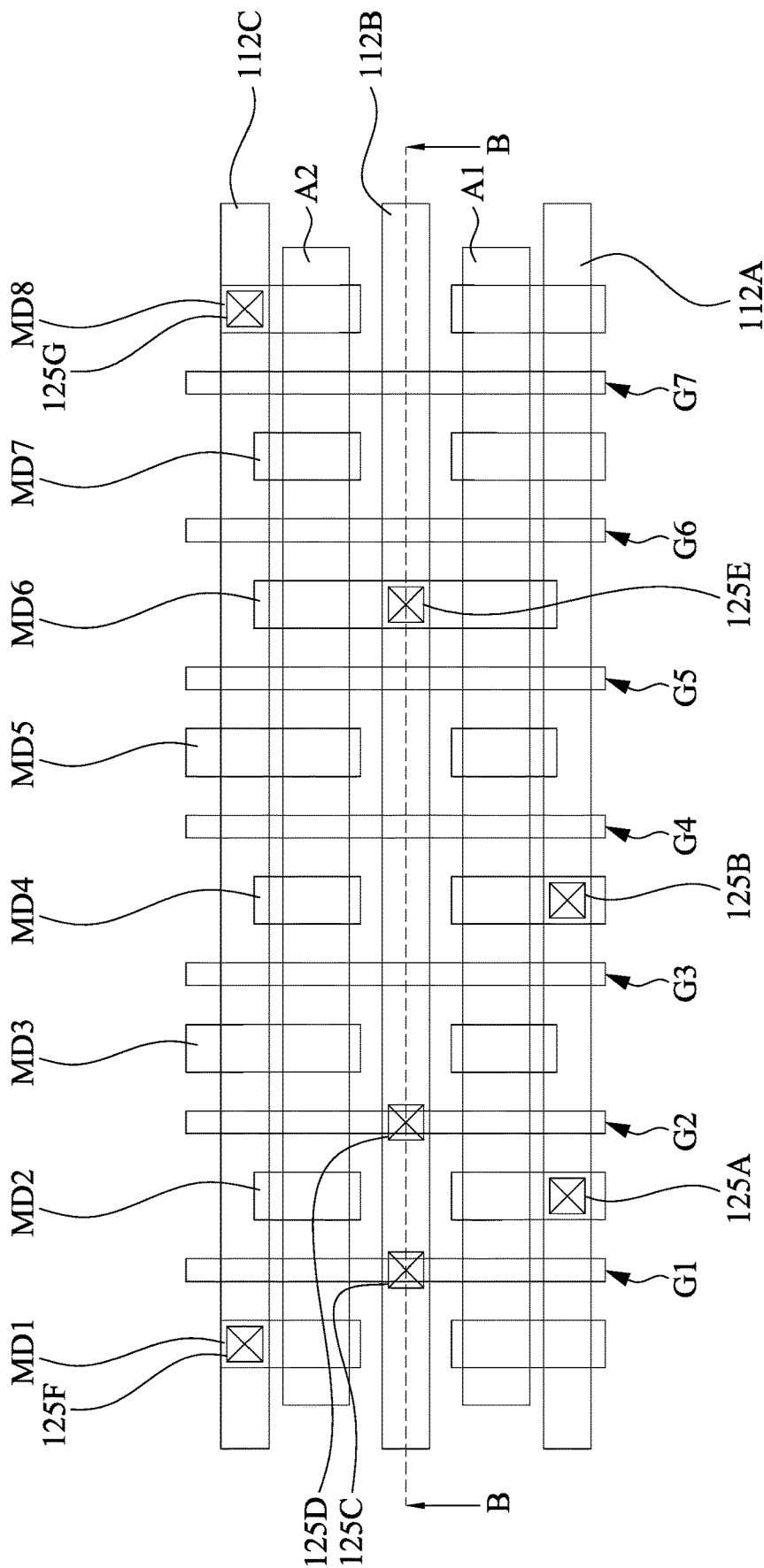
Figure 16B:
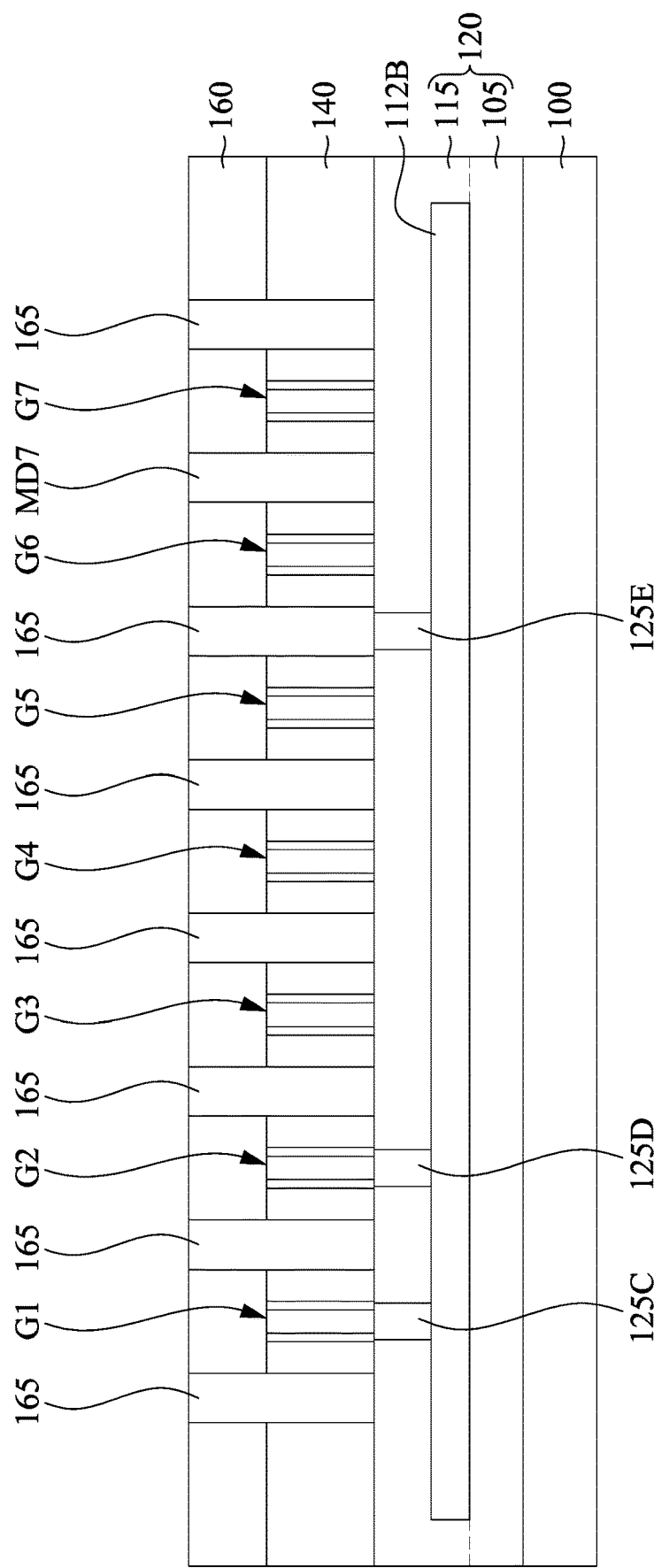

Reference is made to FIGS. 16A and 16B, in which FIG. 16A is a top view of a semiconductor device, and FIG. 16B is a cross-sectional view of line B-B of FIG. 16A. The mask MA is removed. Then, dielectric layer 165 is formed to fill the recesses R1 (see FIG. 15B). In some embodiments where the mask MA is photoresist layer, the mask MA may be removed by, for example, striping. The dielectric layer 165 may be formed by, for example, depositing a dielectric material to fill the recesses R1, and followed by a CMP process to remove excessive dielectric material until top surface of the ILD layer 160 is exposed. In some embodiments, the dielectric layer 165 may include silicon oxide, silicon nitride, silicon oxynitride, tetraethoxysilane (TEOS), phosphosilicate glass (PSG), borophosphosilicate glass (BPSG), low-k dielectric material, and/or other suitable dielectric materials.

Figure 17A:
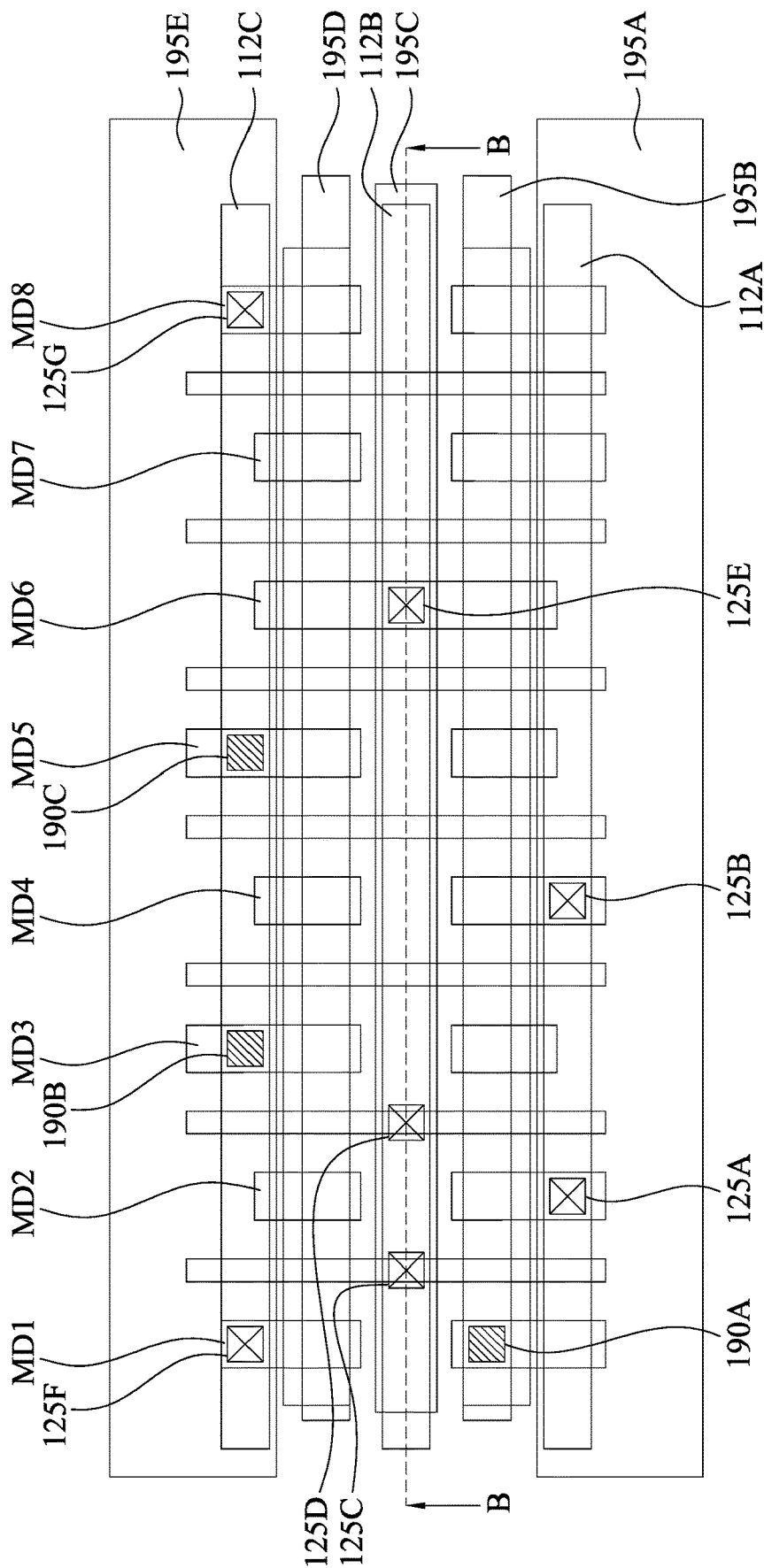
Figure 17B:
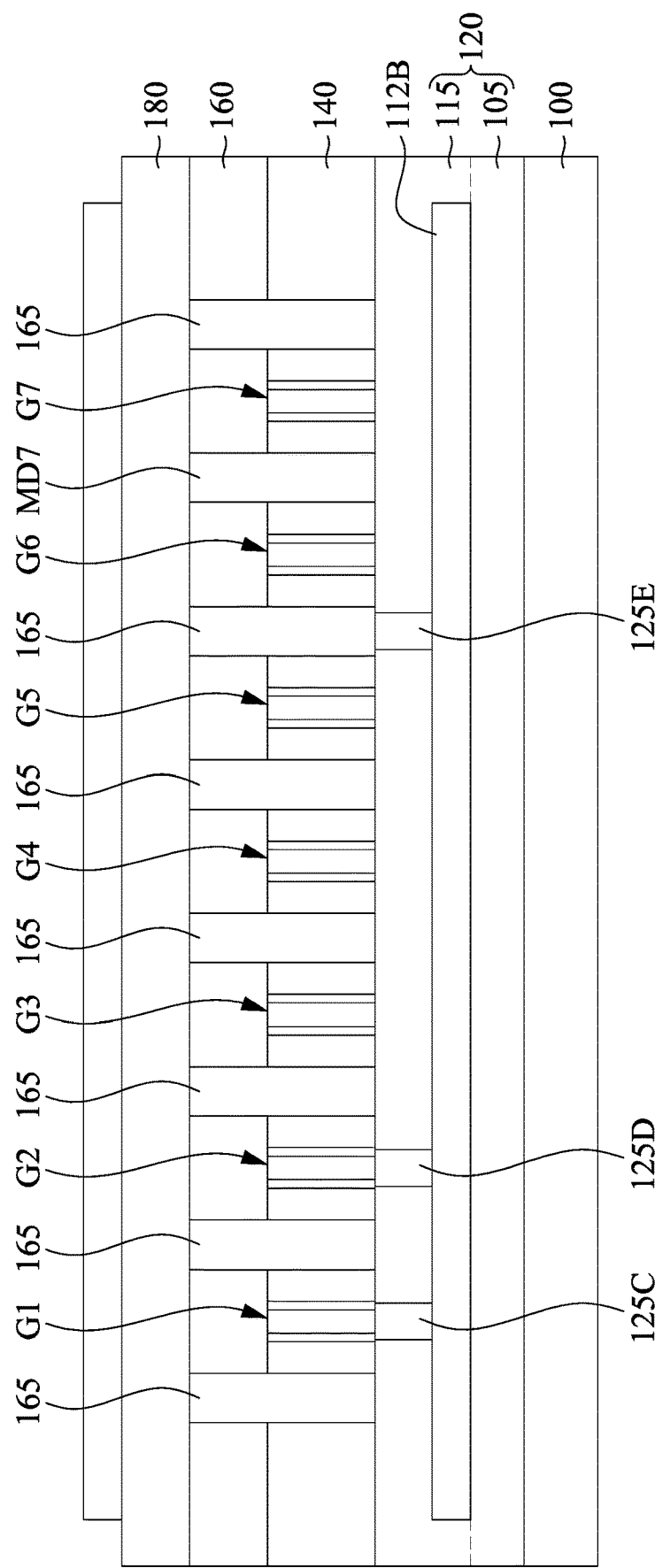

Reference is made to FIGS. 17A and 17B, in which FIG. 17A is a top view of a semiconductor device, and FIG. 17B is a cross-sectional view of line B-B of FIG. 17A. An ILD layer 180 is formed over the ILD layer 160 and contacting the dielectric layer 165. Then, conductive vias 190A, 190B, 190C are formed in the ILD layer 180. In some embodiments, the conductive via 190A is in contact with the source/drain contact MD2, the conductive via 190B is in contact with the source/drain contact MD3, and the conductive via 190C is in contact with the source/drain contact MD5.

Then, metal lines 195A, 195B, 195C, 195D, and 195E are formed over the ILD layer 180. In some embodiments, the metal line 195B is in contact with the conductive via 190A, and the metal line 195E is in contact with the conductive vias 190B and 190C, as shown in FIG. 17A. That is, the source/drain contact MD1 is electrically connected to the metal line 195A. On the other hand, the source/drain contact MD3 is electrically connected to the source/drain contact MD5 via the conductive vias 190B, 190C, and the metal line 195E.

Along the vertical direction (e.g., the direction perpendicular to the top surface of the substrate 100), the metal line 195A vertically overlaps the underlying metal line 112A in the isolation structure 120. In some embodiments, the metal line 195A vertically overlaps the entire metal line 112A. On the other hand, the metal line 195C vertically overlaps the underlying, metal line 112B in the isolation structure 120. Furthermore, the metal line 195E vertically overlaps the underlying metal line 112C in the isolation structure 120. In some embodiments, the metal line 195E vertically overlaps the entire metal line 112C.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that metal lines and conductive vias are formed embedded in an isolation structure. The metal lines and conductive vias provide a routing resource, which will improve the routing flexibility. Another advantage is that, along the vertical direction, the metal lines can be overlapped with the metal layer over gate structure and/or source/drain contact, such that the spacer can be reduced to increase the cell density.

In some embodiments of the present disclosure, a semiconductor device includes a substrate, an active region, an isolation structure, a first metal line, gate structure, source/drain region, a source/drain contact, and a second metal line. The active region protrudes from a top surface of the substrate. The isolation structure is over the substrate and laterally surrounds the active region. The first metal line is in the isolation structure. The gate structure is over the active region. The source/drain region is in the active region. The source/drain contact is over the active region and is electrically connected to the source/drain region. The second metal line is over the gate structure and the source/drain contact, in which the second metal line vertically overlaps the first metal line.

In some embodiments of the present disclosure, a semiconductor device includes a substrate, a first metal line, a first conductive via, a second conductive via, a plurality of gate structures, a plurality of source/drain regions, and a plurality of source/drain contacts. The first metal line is over the substrate, in which a bottom surface of the first metal line is spaced from a top surface of the substrate. The first conductive via and the second conductive via are over the substrate and the first metal line, in which the first conductive via and a second conductive via are in contact with the first metal line. The gate structures are over the substrate and the first and second conductive vias. The source/drain regions are over the substrate and the first and second conductive vias, in which the source/drain regions are on opposite sides of each of the gate structures, respectively, the source/drain contacts are over the substrate, in which the source/drain contacts are adjacent to the gate structures and overlie the source/drain regions, respectively.

In some embodiments of the present disclosure, a method includes forming an active region protruding from a top surface of a substrate; forming a first dielectric layer over the substrate and laterally surrounding the active region; forming a first metal line over the first dielectric layer; forming a second dielectric layer over the substrate and covering the first metal line; patterning the second dielectric layer to form an opening in the second dielectric layer, in which the opening exposes a top surface of the first metal line; and forming a first conductive via in the opening; forming a gate structure over the active region; and forming a source/drain contact over a source/drain region in the active region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming an active region protruding from a top surface of a substrate;
    depositing a dielectric material over the substrate and the active region;
    performing a chemical mechanism polishing process to the dielectric material until a top surface of the active region is exposed;
    etching back the dielectric material to form a first dielectric layer over the substrate and laterally surrounding the active region;
    forming a first metal line over the first dielectric layer;
    forming a second dielectric layer over the substrate and covering the first metal line;
    patterning the second dielectric layer to form an opening in the second dielectric layer, wherein the opening exposes a top surface of the first metal line;
    forming a first conductive via in the opening;
    forming a gate structure over the active region; and
    forming a source/drain contact over a source/drain region in the active region.

2. The method of claim 1, further comprising forming a second metal line over the gate structure and the source/drain contact, wherein along a vertical direction, the second metal line overlaps the first metal line.

3. The method of claim 2, further comprising forming a second conductive via prior to forming the second metal line, wherein the first conductive via is in contact with a bottom surface of the source/drain contact, and the second conductive via is in contact with a top surface of the source/drain contact.

4. The method of claim 1, wherein forming the gate structure is performed such that the gate structure is in contact with a top surface of the first conductive via.

5. The method of claim 1, wherein the second dielectric layer is in contact with the first dielectric layer.

6. A method, comprising:
    forming an active region protruding from a top surface of a substrate;
    forming a metal layer over the substrate and laterally surrounding the active region;
    etching back the metal layer to lower a top surface of the metal layer to a position lower than a top surface of the active region;
    patterning the metal layer to form a first metal line;
    forming a gate structure over the active region after the first metal line is formed; and
    forming a source/drain contact in contact with a source/drain region of the active region, wherein the source/drain contact vertically overlaps the first metal line.

7. The method of claim 6, further comprising forming a first dielectric layer over the substrate prior to forming the metal layer.

8. The method of claim 7, further comprising forming a second dielectric layer covering the first metal line prior to forming the gate structure.

9. The method of claim 8, wherein the second dielectric layer is in contact with a top surface of the first dielectric layer.

10. The method of claim 6, further comprising forming a conductive via in contact with the first metal line prior to forming the gate structure, wherein the source/drain contact is in contact with the conductive via.

11. The method of claim 10, wherein forming the conductive via comprises:
    depositing a dielectric layer covering the first metal line;
    patterning the dielectric layer to form an opening;
    filling a conductive material in the opening of the dielectric layer; and
    performing a chemical mechanism polishing process until a top surface of the active region is exposed.

12. The method of claim 6, further comprising forming a conductive via in contact with the first metal line prior to forming the gate structure, wherein the gate structure is in contact with the conductive via.

13. A method, comprising:
    forming a first active region and a second active region protruding from a top surface of a substrate;
    forming a first metal line over the substrate;
    after forming the first metal line, forming a first gate structure and a second gate structure over the first active region and the second active region, respectively; and
    forming a first source/drain contact and a second source/drain contact over a source/drain region of the first active region and a source/drain region of the second active region, respectively, wherein the first source/drain contact is electrically connected to the second source/drain contact through the first metal line.

14. The method of claim 13, further comprising:
    forming a first dielectric layer over the substrate prior to forming the first metal line; and
    forming a second dielectric layer covering the first metal line and in contact with the first dielectric layer.

15. The method of claim 13, further comprising forming a first conductive via and a second conductive via in contact with the first metal line, wherein first source/drain contact and the second source/drain contact are in contact with the first conductive via and the second conductive via, respectively.

16. The method of claim 15, further comprising:
    forming a third conductive via and a fourth conductive via in contact with the first source/drain contact and the second source/drain contact, respectively; and
    forming a second metal line in contact with the third conductive via and the fourth conductive via.

17. The method of claim 16, wherein the second metal line vertically overlaps the first metal line.

18. The method of claim 13, wherein forming the first metal line comprises:
    forming a metal layer over the substrate and laterally surrounding the first and second active regions;
    etching back the metal layer to lower a top surface of the metal layer to a position lower than top surfaces of the first and second active regions; and
    patterning the metal layer.

19. The method of claim 13, further comprising:
    forming an interlayer dielectric (ILD) layer in contact with top surfaces of the first and second source/drain contacts; and
    forming a second metal line in contact with a top surface of the ILD layer, wherein an entirety of the second metal line vertically overlaps the first metal line.

20. The method of claim 19, wherein the ILD layer is free from a conductive material that is in contact with the top surfaces of the first and second source/drain contacts and a bottom surface of the second metal line.

\* \* \* \* \*